United States Patent [19]
Hashizume et al.

[11] Patent Number: 5,436,477
[45] Date of Patent: Jul. 25, 1995

[54] SEMICONDUCTOR MEMORY DEVICE WITH HIGH DIELECTRIC CAPACITOR STRUCTURE

[75] Inventors: Yasushi Hashizume; Hiroki Shinkawata, both of Hyogo, Japan

[73] Assignee: Mitsubishi Denki Kabushiki Kaisha, Tokyo, Japan

[21] Appl. No.: 262,116

[22] Filed: Jun. 17, 1994

[30] Foreign Application Priority Data

Jun. 24, 1993 [JP] Japan .................. 5-153706
May 13, 1994 [JP] Japan .................. 6-099807

[51] Int. Cl.⁶ .............................................. G11C 11/22
[52] U.S. Cl. .................................. 257/310; 257/295; 257/306
[58] Field of Search .................. 257/310, 295, 306; 365/145

[56] References Cited

U.S. PATENT DOCUMENTS

| | | | |
|---|---|---|---|
| 5,043,049 | 8/1991 | Takenaka | 257/310 |
| 5,046,043 | 9/1991 | Miller et al. | 257/310 |
| 5,109,357 | 4/1992 | Eaton, Jr. | 365/145 |

FOREIGN PATENT DOCUMENTS

| | | | |
|---|---|---|---|
| 497982 | 8/1992 | European Pat. Off. | 257/295 |
| 4107165 | 10/1991 | Germany | 365/145 |
| 3-21062 | 1/1991 | Japan | |
| 3-142966 | 6/1991 | Japan | |
| 91/01281 | 4/1992 | WIPO | 257/310 |
| 91/01398 | 4/1992 | WIPO | 257/310 |

OTHER PUBLICATIONS

IDEM 91, "A Stacked Capacitor With $(Ba_xSr_{1-x})$ For 256M Dram", pp. 823–826.

*Primary Examiner*—Robert P. Limanek
*Attorney, Agent, or Firm*—Lowe, Price, LeBlanc & Becker

[57] ABSTRACT

Transfer gate transistors are formed on a main surface of a semiconductor substrate. The transfer gate transistors have impurity regions for serving as source/drain regions. A first interlayer insulating film having a substantially flat upper surface is formed to cover the transfer gate transistors. The first interlayer insulating film is provided with contact holes reaching the impurity regions. Plugs are formed in the contact holes. Capacitors are only formed on the flat upper surface of the first interlayer insulating film. Lower electrodes of the capacitors and the plugs are electrically connected with each other through barrier layers. Thus, it is possible to improve capacitances of capacitors in a DRAM.

7 Claims, 22 Drawing Sheets

SEMICONDUCTOR MEMORY DEVICE WITH HIGH DIELECTRIC CAPACITOR STRUCTURE

BACKGROUND OF THE INVENTION

1. Field of the Invention

The present invention relates to a semiconductor memory device and a method of manufacturing the same, and more particularly, it relates to a structure of a DRAM (dynamic random access memory) which can input/output memory information at random, and a method of manufacturing the same.

2. Description of the Background Art

In general, a DRAM (dynamic random access memory) is known as a semiconductor memory device which can input/output memory information at random. Such a DRAM is generally provided with a memory cell array part which is a storage region for storing a number of data and a peripheral circuit part which is required for inputting/outputting data from/to the exterior.

FIG. 29 is a block diagram showing an exemplary structure of a general DRAM 150. Referring to FIG. 29, DRAM 150 comprises a memory cell array 151 for storing memory information, a row and column address buffer 152 for receiving address signals, for selecting memory cells forming unit memory circuits, from the exterior, a row decoder 153 and a column decoder 154 for specifying the memory cells by decoding the address signals, a sense refresh amplifier 155 for amplifying and reading data stored in the specified memory cells, a data-in buffer 156 and a data-out buffer 157 for inputting/outputting data, and a clock generator 158 for generating clock signals.

The memory cell array 151 occupying a large area on a semiconductor chip is provided with a plurality of memory cells for storing information, which are arranged in the form of a matrix. In general, each memory cell is formed by a single MOS transistor and a single capacitor which is connected thereto. Such a memory cell is widely known as a one-transistor one-capacitor memory cell. It is possible to readily improve the degree of integration of a memory cell array with such memory cells having simple structures, which are widely applied to a mass storage DRAM.

Further, such memory cells of the DRAM can be classified into some types in response to the structures of capacitors thereof. In a stacked type capacitor, for example, a principal part of the capacitor extends toward upper portions of a gate electrode and a field oxide film, so that opposite areas of electrodes are increased in the capacitor.

Consequently, it is possible to increase the capacitance of the capacitor. In the stacked type capacitor having such characteristics, it is possible to ensure its capacitance also when elements are miniaturized following high integration of a semiconductor device. Thus, the stacked type capacitor is widely employed following integration of the semiconductor device.

In a 256 megabit DRAM having further miniaturized elements, for example, it is difficult to ensure a constant capacitance even if stacked type capacitors are employed.

In order to increase the capacitance, therefore, there has been made an attempt of preparing a dielectric film of a capacitor from a high dielectric material (a material having a high dielectric constant) such as PZT (lead zirconate titanate ceramic) or the like. FIG. 30 shows an exemplary DRAM employing a high dielectric film of PZT or the like for a capacitor.

Referring to FIG. 30, field oxide films 103 are formed at a space on a p-type semiconductor substrate 101 in element isolating regions of its main surface. Channel stopper layers 107 are formed under lower surfaces of the field oxide films 103.

Transfer gate transistors 102a and 102b are formed on element forming regions of the main surface of the semiconductor substrate 101. The transfer gate transistor 102a has impurity regions 105a and 105b for serving as source/drain regions, and a gate electrode 111b. On the other hand, transfer gate transistor 102b has impurity regions 105b and 105c for serving as source/drain regions, and a gate electrode 111c.

The gate electrodes 111b and 111c are formed on the main surface of the semiconductor substrate 101 with gate insulating films 109 interposed therebetween. On the other hand, gate electrodes 111a and 111d are also formed on the field oxide films 103 respectively.

Oxide films 113 are formed to cover the gate electrodes 111a, 111b, 111c and 111d. A buried bit line 116 is formed to extend from a surface of the impurity region 105b toward surfaces of the oxide films 113. A flattened first interlayer insulating film 115 is formed to cover the buried bit line 116 and the oxide films 113.

First interlayer insulating film 115 is provided with contact holes 117 reaching impurity regions 105a and 105c. Plugs 118 of polycrystalline silicon or the like are formed in contact holes 117. Capacitors 120 are formed on first interlayer insulating film 115. Capacitors 120 have lower electrodes 121 of platinum (Pt) or the like, high dielectric films 123, and upper electrodes 125 of platinum (Pt) or the like.

Barrier layers 119 of TiN or the like are formed along upper surfaces of plugs 118 and first interlayer insulating film 115. Lower electrodes 121 of capacitors 120 are formed on barrier layers 119. Due to such provision of the barrier layers 119, it is possible to inhibit the materials forming lower electrodes 121 of capacitors 120 and plugs 118 from mutual diffusion.

A second interlayer insulating film 127 is formed to cover the capacitors 120. In second interlayer insulating film 127, contact holes 129 are formed in portions located on the upper electrodes 125 of capacitors 120. An interconnection layer 131 of aluminum (Al) or the like is formed on inner surfaces of contact holes 129 and on second interlayer insulating film 127.

Positional relation between capacitors 120 and plugs 118 in the conventional DRAM shown in FIG. 30 is now described with reference to FIG. 31. FIG. 31 is a plan view typically showing the positional relation between capacitors 120 and plugs 118. Throughout the specification, the term "capacitor" (120) indicates a portion having a stacked structure of a lower electrode (121), a high dielectric film (123) and an upper electrode (125), to substantially function as a capacitor. A section taken along the line XXX—XXX in FIG. 31 corresponds to that shown in FIG. 30.

Referring to FIG. 31, plugs 118 and capacitors 120 overlap with each other in a plan view.

With reference to FIGS. 32 to 41, steps of manufacturing the conventional DRAM shown in FIG. 30 are now described. FIGS. 32 to 41 are partial sectional views showing first to tenth steps of manufacturing the conventional DRAM.

Referring to FIG. 32, field oxide films 103 are formed in element isolating regions of the main surface of p-type semiconductor substrate 101 by selective oxidation or the like. At this time, a p-type impurity is previously introduced into the element isolating regions in formation of the field oxide films 103, thereby forming channel stopper layers 107 simultaneously with field oxide films 103.

Then, gate insulating films 109 are formed on the main surface of semiconductor substrate 101 by thermal oxidation or the like. Gate electrodes 111a, 111b, 111c and 111d are formed on gate insulating films 109. These gate electrodes 111a, 111b, 111c and 111d are employed as masks to introduce an n-type impurities into the main surface of semiconductor substrate 101, thereby forming impurity regions 105a, 105b and 105c. Then, oxide films 113 are formed to cover gate electrodes 111a, 111b, 111c and 111d.

Referring to FIG. 33, a conductive layer 116a of polycrystalline silicon or the like is formed by CVD or the like. Referring to FIG. 34, conductive layer 116a is patterned to form a buried bit line 116 on impurity region 105b. Then, a first interlayer insulating film 115 is formed to cover buried bit line 116 and oxide films 113 by CVD or the like. Then, first interlayer insulating film 115 is flattened by heat treatment.

Referring to FIG. 35, contact holes 117 are formed in regions of first interlayer insulating film 115 located on impurity regions 105a and 105c. Referring to FIG. 36, a conductive layer 118a of polycrystalline silicon or the like is formed on inner surfaces of contact holes 117 and on first interlayer insulating film 115.

Referring to FIG. 37, conductive layer 118a is etched back by dry etching, thereby forming plugs 118. At this time, the upper surface of first interlayer insulating film 115 is overetched not to leave conductive layer 118a in step portions (not shown). Thus, upper surfaces of plugs 118 are lower in contact holes 117.

Referring to FIG. 38, a barrier layer 119 of TiN, Ta, Ti/TiN/Ti or the like is deposited by sputtering or the like on plugs 118 and first interlayer insulating film 115. A lower electrode 121 of platinum (Pt) or the like is formed on barrier layer 119 by sputtering or the like. Further, a high dielectric film 123 of SrTiO$_3$ or the like is formed on lower electrode 121 at a temperature of not more than about 550° C. by sputtering or the like. An upper electrode 125 of platinum (Pt) or the like is formed on high dielectric film 123 again by sputtering or the like.

Referring to FIG. 39, resist patterns 140 which are patterned in the form of capacitors are formed on upper electrode 125. The resist patterns 140 are employed as masks to carry out etching, thereby forming capacitors 120, as shown in FIG. 39.

Referring to FIG. 40, a second interlayer insulating film 127 is formed to cover capacitors 120 by CVD or the like. As shown in FIG. 41, contact holes 129 are formed in second interlayer insulating film 127 in portions located on upper electrodes 125 of capacitors 120. Then, an interconnection layer 131 of aluminum (Al) or the like is formed on inner surfaces of contact holes 129 and on second interlayer insulating film 127 by sputtering or the like. The DRAM shown in FIG. 30 is formed through the aforementioned steps.

In the aforementioned DRAM, it is possible to increase the capacitances of the capacitors having high dielectric films. However, the aforementioned conventional DRAM has a problem as hereafter described with reference to FIG. 42. FIG. 42 is a sectional view showing connected portions of each capacitor 120 and each plug 118 in the conventional DRAM.

Referring to FIG. 42, overetching is carried out so as to prevent the material of plug 118 from leaving on first interlayer insulating film 115, whereby the upper surface of plug 118 is lower in the contact hole 117, as hereinabove described. Thus, a step is defined between an upper surface 115a of first interlayer insulating film 115 and that of plug 118.

Barrier layer 119, lower electrode 121, high dielectric film 123 and upper electrode 125 are formed along the upper surface of plug 118 and the upper surface 115a of first interlayer insulating film 115. Barrier layer 119, lower electrode 121, high dielectric film 123 and upper electrode 125 are mainly formed by sputtering, as hereinabove described. In particular, high dielectric film 123 is formed by sputtering, since it is difficult to attain desired film characteristics by CVD.

In general, a layer which is formed by sputtering is inferior in step coverage. Therefore, locally thinned portions are defined in barrier layer 119, lower electrode 121, high dielectric film 123 and upper electrode 125 along the step.

For example, high dielectric film 123 has a thickness t in a portion located on the upper surface 115a of first interlayer insulating film 115, while its thickness is reduced to t1 in a portion located on the step. Such a locally thinned portion of high dielectric film 123 leads to the following problem:

The lower limit for the thickness of high dielectric film 123 inevitably depends on a leakage current and a withstand voltage. In other words, it is necessary to decide the thickness of high dielectric film 123 in capacitor 120 to be in excess of the lower limit in the smallest portion.

It is assumed here that the lower limit for the thickness of high dielectric film 123 is a Å and the thickness t1 of the portion located on the step is about half the thickness t of the portion located on the upper surface 115a of first interlayer insulating film 115. In this case, the thickness t of the high dielectric film 123 must be in excess of $(2 \times a)$ Å in the portion located on the upper surface 115a of first interlayer insulating film 115.

On the other hand, the amount of stored charges is in proportion to the inverse number of the thickness of the dielectric film. Therefore, the amount of stored charges is increased, i.e., the capacitance is increased as the dielectric film is reduced in thickness. In the aforementioned case, however, the amount of stored charges is substantially halved since the thickness of high dielectric film 123 is substantially doubled in most part of the capacitor 120. Consequently, the capacitance of the capacitor 120 is disadvantageously reduced.

SUMMARY OF THE INVENTION

The present invention has been proposed in order to solve the aforementioned problem, and an object thereof is to provide a semiconductor memory device which can increase the capacitance of a capacitor by substantially uniformly minimizing the thickness of a high dielectric film in the capacitor, and a method of manufacturing the same.

A semiconductor memory device according to the present invention comprises a first conductivity type semiconductor substrate having a main surface, a second conductivity type impurity region, an interlayer insulating film, a capacitor, and a conductor part. The second conductivity type impurity region is formed in the main surface of the semiconductor substrate. The interlayer insulating film is formed on the main surface of the semiconductor substrate, and has a contact hole reaching a surface of the impurity region. The capacitor includes a first electrode, a high dielectric film, consisting of a material having a high dielectric constant, which is formed on the first electrode, and a second electrode which is formed on the high dielectric film. The capacitor is formed only on an upper surface of the interlayer insulating film excluding a portion above the contact hole. The conductor part is formed at least in the contact hole, to electrically connect the first or second electrode with the impurity region.

In the semiconductor memory device according to the present invention, the second electrode is formed only on a substantially flat region of the interlayer insulating film. Consequently, the stacked structure of the first electrode, the high dielectric film and the second electrode for substantially serving as a capacitor is formed only on the substantially flat region of the interlayer insulating film.

In the capacitor, therefore, the first electrode serving as an underlayer for the high dielectric film has a substantially flat surface. Thus, no locally thinned portion is defined in the high dielectric film, dissimilar to the prior art. Consequently, it is possible to substantially uniformly set the thickness of the high dielectric film at the lower limit in the capacitor.

Thus, it is not necessary to set a locally thinned portion at the lower limit in the high dielectric film, dissimilar to the prior art. Consequently, it is possible to reduce the thickness of the high dielectric film as compared with the prior art. Therefore, it is possible to increase the capacitance of the capacitor as compared with the prior art, although the planar area of the capacitor itself is slightly reduced.

In a first aspect of a method of manufacturing a semiconductor memory device according to the present invention, a second conductivity type impurity region is first formed in a main surface of a first conductivity type semiconductor substrate. An interlayer insulating film is formed on the main surface of the semiconductor substrate. A contact hole reaching a surface of the impurity region is formed in the interlayer insulating film. A plug electrode is formed in the contact hole. A first electrode, a high dielectric film consisting of a material having a high dielectric constant, and a second electrode are successively formed on the plug electrode and the interlayer insulating film. A portion of the second electrode located above the contact hole is removed.

In the first aspect of the method of manufacturing a semiconductor memory device according to the present invention, the portion of the second electrode located above the contact hole is removed after successive formation of the first electrode, the high dielectric film and the second electrode. Thus, a capacitor is formed only on an upper surface of the interlayer insulating film excluding a portion above the contact hole. Therefore, it is possible to substantially flatten a surface of the first electrode serving as an underlayer for the high dielectric film in the capacitor. Thus, it is possible to substantially uniformly set the thickness of the high dielectric film at the lower limit therefor in the capacitor. Consequently, it is possible to obtain a semiconductor memory device having an increased capacitance.

In a second aspect of the method of manufacturing a semiconductor memory device according to the present invention, a second conductivity type impurity region is first formed in a main surface of a first conductivity type semiconductor substrate. A first interlayer insulating film is formed on the main surface of the semiconductor substrate. A stacked structure of a first electrode, a high dielectric film consisting of a material having a high dielectric constant, and a second electrode is formed on the first interlayer insulating film. A second interlayer insulating film is formed on the first interlayer insulating film to cover the stacked structure. A first contact hole is formed through the first and second interlayer insulating films and reach the impurity region. A second contact hole is formed in the second interlayer insulating film to reach a surface of the second electrode. A conductor part is formed in the first and second contact holes to electrically connect the second electrode with the impurity region.

In the second aspect of the method of manufacturing a semiconductor memory device according to the present invention, the following effect is obtained in addition to the same effect as that of the first aspect. According to this aspect, it is possible to form the conductor part after formation of the high dielectric film, thereby improving the quality of the high dielectric film. The reason for this is now described in detail.

When the high dielectric film is formed at a high temperature of at least about 600° C., its characteristics such as the dielectric constant are improved (see FIG. 28). When the high dielectric film is formed at such a high temperature of at least 600° C. after formation of the conductor part, however, there is a high possibility of reaction between the first electrode and the conductor part or oxidation of the conductor part caused by permeation of oxygen through the first electrode. In the prior art since the high dielectric film is formed after formation of the conductor part, therefore, it is necessary to set the temperature for forming the high dielectric film at a low level of not more than about 550° C. However, no such problem is caused when the conductor part is formed after formation of the high dielectric film. Thus, it is possible to form the high dielectric film at a high temperature of at least about 600° C. Therefore, it is possible to improve characteristics of the high dielectric film such as the dielectric constant. Consequently, the capacitance of the capacitor is increased and it is possible to obtain a highly reliable semiconductor memory device.

In a third aspect of the method of manufacturing a semiconductor memory device according to the present invention, a second conductivity type impurity region is first formed in a main surface of a first conductivity type semiconductor substrate. An interlayer insulating film is formed on the main surface of the semiconductor substrate. A first electrode and a high dielectric film consisting of a material having a high dielectric constant are successively stacked on the interlayer insulating film. A contact hole is formed in the interlayer insulating film to reach the impurity region. A conductor part is formed to extend from the inside of the contact hole toward a surface of the high dielectric film.

In the third aspect of the method of manufacturing a semiconductor memory device according to the present invention, the following effect is attained in addition to the same effects as that of the second aspect: According to this aspect, it is possible to form a second electrode of a capacitor and the conductor part in the same step. Thus, it is possible to simplify the manufacturing steps.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are described with reference to FIGS. 1 to 28.

(First Embodiment)

Figure 1:
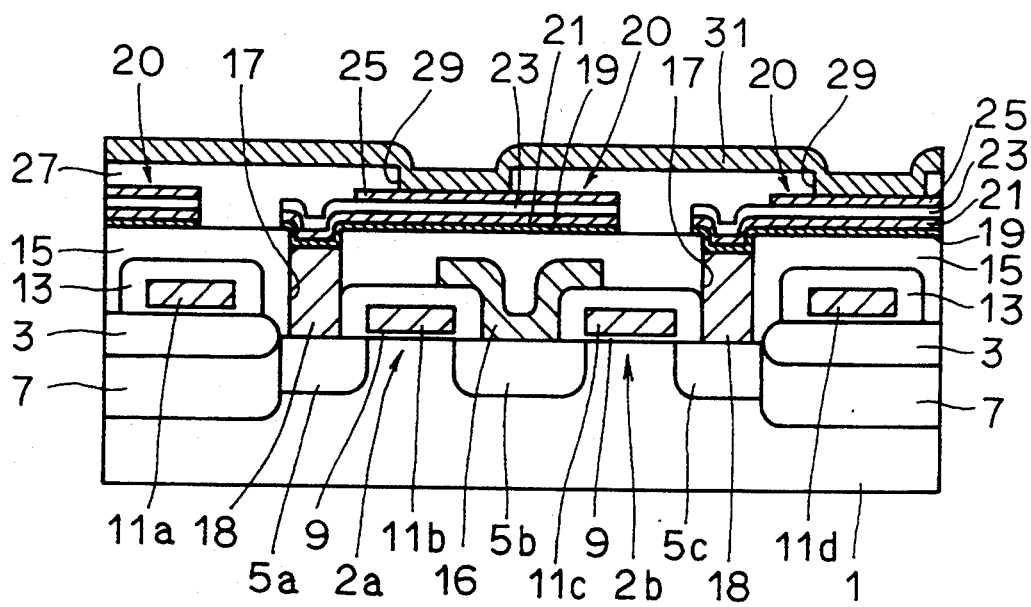
FIG. 1 is a sectional view showing a memory cell array part of a DRAM according to a first embodiment of the present invention.
Figure 2:
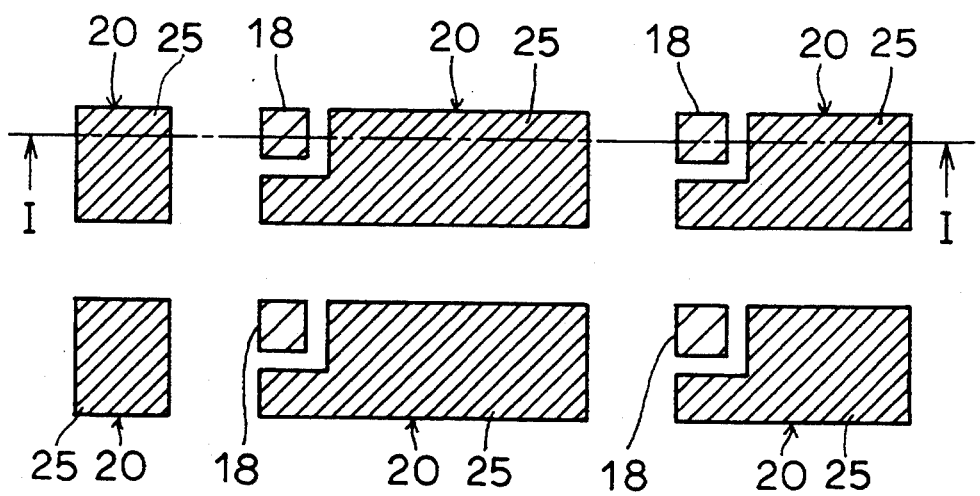
FIG. 2 is a plan view typically showing positional relation between plugs and capacitors in the first embodiment of the present invention.
Figure 3:
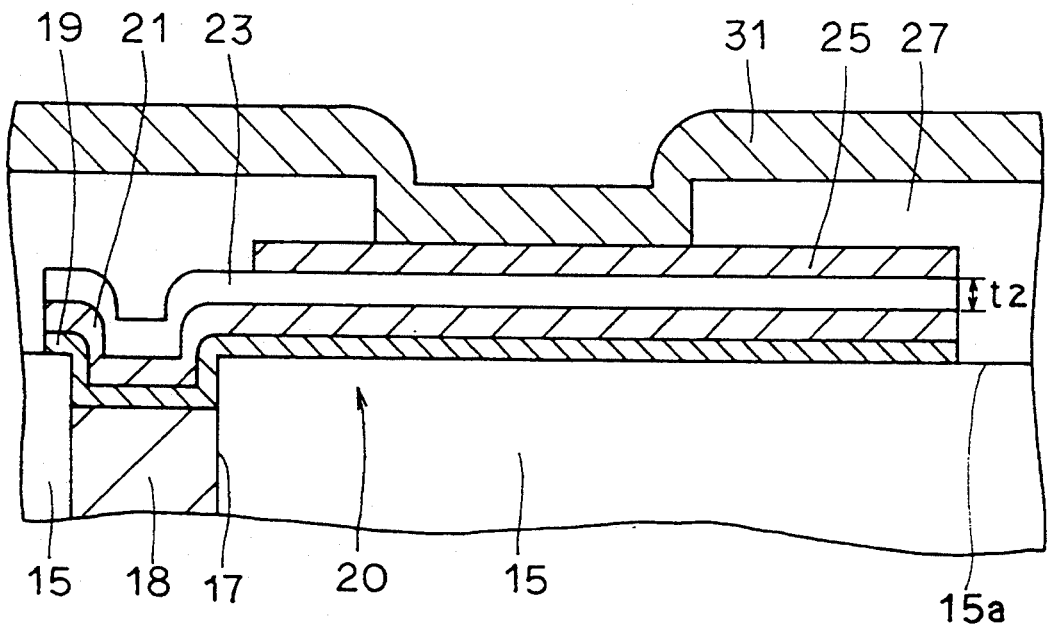
FIG. 3 is an enlarged sectional view showing each capacitor in the first embodiment of the present invention.

A first embodiment of the present invention is now described with reference to FIGS. 1 to 8. FIG. 1 is a partial sectional view showing a memory cell array part of a DRAM according to the first embodiment of the present invention. FIG. 2 is a plan view typically showing positional relation between plugs 18 and upper electrodes 25 of capacitors 20 in this embodiment. FIG. 3 is a sectional view showing each capacitor 20 provided in this embodiment in an enlarged manner.

With reference to FIGS. 1 to 3, the structure of the DRAM according to the first embodiment of the present invention is now described. Referring to FIG. 1, field oxide films 3 are formed at a space on a p-type semiconductor substrate 1 in element isolating regions of its main surface. Channel stopper layers 7 are formed under the field oxide films 3.

Transfer gate transistors 2a and 2b are formed on element forming regions of the main surface of the p-type semiconductor substrate 1 respectively. Transfer gate transistor 2a has n-type impurity regions 5a and 5b which are formed in the main surface of the semiconductor substrate 1 at a space, and a gate electrode 11b which is formed on a channel region between impurity regions 5a and 5b with a gate insulating film 9 interposed therebetween.

Transfer gate transistor 2b has n-type impurity regions 5b and 5c which are formed in main surface of semiconductor substrate 1 at a space, and a gate electrode 11c which is formed on a channel region between impurity regions 5b and 5c with a gate insulating film 9 interposed therebetween.

On the other hand, gate electrodes 11a and 11d of other transfer gate transistors extend on field oxide films 3. Oxide films 13 are formed to cover gate electrodes 11a, 11b, 11c and 11d respectively. A buried bit line 16 of polycrystalline silicon or the like is formed on impurity region 5b, to be electrically connected with impurity region 5b. This buried bit line 16 is so formed that its ends extend onto oxide films 13 which are in proximity to impurity region 5b.

A first interlayer insulating film 15 is formed to cover buried bit line 16 and oxide films 13. First interlayer insulating film 15 is so flattened that its upper surface is substantially flat. Further, first interlayer insulating film 15 is provided with contact holes 17 in prescribed positions. These contact holes 17 are provided in portions located on impurity regions 5a and 5c.

Plugs 18 are formed in contact holes 17. These plugs 18 are made of polycrystalline silicon in which an impurity is introduced or the like. Upper surfaces of plugs 18 are lower in the contact holes 18, since overetching is performed in formation of plugs 18, as described above with reference to the prior art. In regions above plugs 18, therefore, steps are defined between the upper surfaces of plugs 18 and that of first interlayer insulating film 15.

Capacitors 20 are formed on first interlayer insulating film 15. Barrier layers 19 are formed along the upper surfaces of plugs 18 and that of first interlayer insulating film 15. These barrier layers 19 are made of TiN, Ta, Ti/TiN/Ti or the like. Barrier layers 19, which are formed also on the steps between the upper surfaces of plugs 18 and that of first interlayer insulating film 15, have locally thinned portions on the steps, since barrier layers 19 are mainly formed by sputtering.

Lower electrodes 21 of capacitors 20 are formed on barrier layers 19. These lower electrodes 21 of capacitors 20 are preferably made of at least one material selected from Ir, Pt, Pd, Ph, Ni, W, a Pt alloy, a Pd alloy, a Ph alloy, an Ni alloy, a W alloy, $RuO_2$, $SrRuO_3$ and $ReO_2$. Thus, it is possible to form high dielectric films 23 on capacitor lower electrodes 21, as described below. Lower electrodes 21 are preferably about 500 Å to about 2000 Å in thickness.

High dielectric films 23 of a material having a high dielectric constant are formed on lower electrodes 21. High dielectric films 23 are made of $(Ba, Sr)TiO_3(STO)$, $(Pb, La)(Zr, Ti)O_3$, PZT or the like. Further, high dielectric films 23 are preferably polycrystalline films having perovskite crystal structures, so that it is possible to increase the capacitances of capacitors 20 and improve reliability thereof. High dielectric films 23 are preferably about 500 Å to 1000 Å in thickness. High dielectric films 23 may be made of another perovskite material having a high dielectric constant, or formed by stacked films of the aforementioned materials.

Upper electrodes 25 of capacitors 20 are formed on high dielectric films 23. At this time, upper electrodes 25 are formed on portions excluding the steps between the upper surfaces of plugs 18 and that of first interlayer insulating film 15. In other words, upper electrodes 25 are formed only on substantially flat regions of first interlayer insulating film 15. Thus, stacked structures of lower electrodes 21, high dielectric films 23 and upper electrodes 25 providing capacitors 20 are formed only on substantially flat portions of the upper surface of first interlayer insulating film 15.

A second interlayer insulating film 27 is formed to cover capacitors 20. In the second interlayer insulating film 27, contact holes 29 are provided in portions located on upper electrodes 25. An interconnection layer 31 is formed on inner surfaces of contact holes 29 and an upper surface of second interlayer insulating film 27. The interconnection layer 31 are made of aluminum (Al), tungsten (W), tungsten silicide (WSi), copper (Cu) or the like.

With reference to FIG. 2, description is now made on planar positional relation between plugs 18 and upper electrodes 25 of capacitors 20 provided in this embodiment. Referring to FIG. 2, upper electrodes 25 are formed to avoid the regions provided with the plugs 18, as hereinabove described. Thus, it is possible to form capacitors 20 only on substantially flat regions of the upper surface of first interlayer insulating film 15. Referring to FIG. 2, a section taken along the line I—I corresponds to that shown in FIG. 1.

With reference to FIG. 3, the structure of each capacitor 20 is now described in more detail. Referring to FIG. 3, lower electrode 21 extends onto the upper surface of plug 18, while only a portion which is formed on a flat region of upper surface 15a of first interlayer insulating film 15 serves as capacitor 20.

In capacitor 20, therefore, lower electrode 21 has a flat surface. High dielectric film 23 is formed on this flat surface. Therefore, high dielectric film 23 which is formed on the flat surface has a substantially uniform thickness t2 in capacitor 20.

Thus, it is possible to uniformly set the thickness t2 of high dielectric film 23 at the lower limit therefor. It is assumed here that the term "lower limit" for the thickness of high dielectric film 23 indicates the minimum thickness required for high dielectric film 23 in consideration of a leakage current in or the withstand voltage of capacitor 20.

Thus, it is possible to reduce the thickness of high dielectric film 23 in capacitor 20 as compared with the prior art, thereby increasing the capacitance as compared with the prior art.

With reference to FIGS. 4 to 7, a method of manufacturing the DRAM according to the first embodiment of the present invention is now described. FIGS. 4 to 7 are partial sectional views showing seventh to tenth steps of the method of manufacturing the DRAM according to the first embodiment of the present invention. First to sixth steps are similar to those of the prior art, and hence redundant description is omitted.

Figure 4:
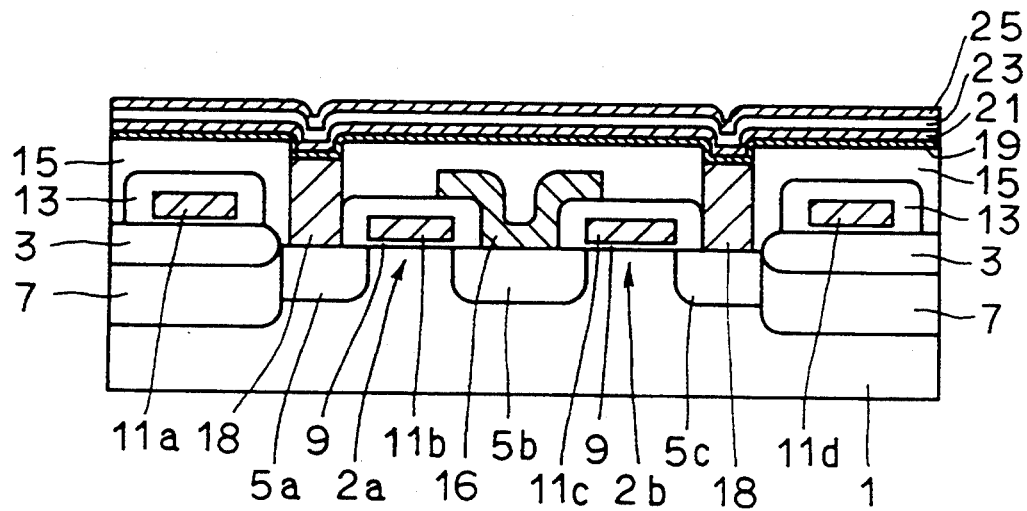
FIGS. 4 to 7 are sectional views showing seventh to tenth steps of a method of manufacturing the DRAM according to the first embodiment of the present invention.
Figure 5:
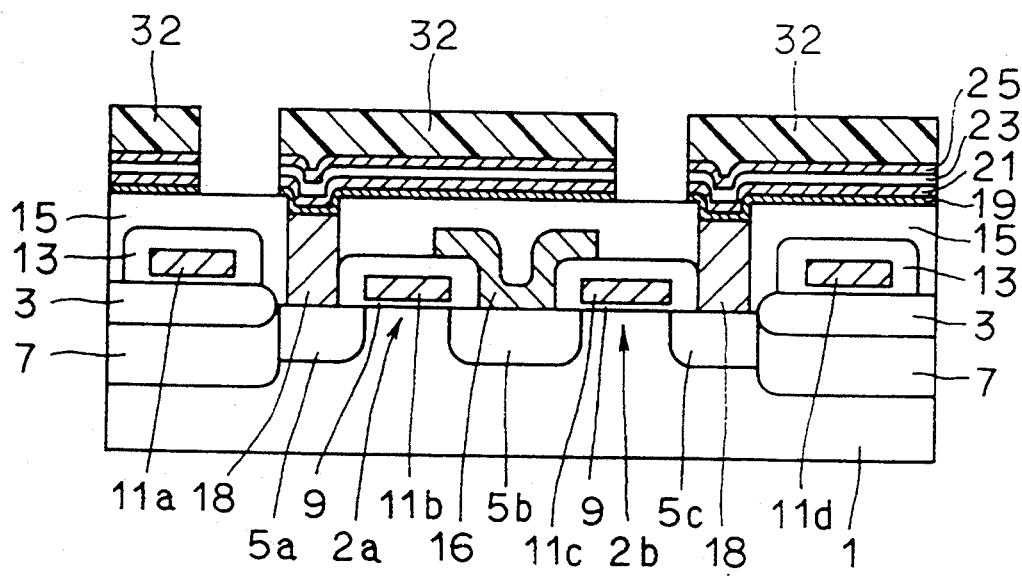

Referring to FIG. 4, elements up to an upper electrode 25 are formed through steps similar to those of the prior art. Referring to FIG. 5, resist patterns 32 which are patterned in prescribed shapes are formed on upper electrode 25. Resist patterns 32 are employed as masks to successively pattern upper electrodes 25, high dielectric films 23, lower electrodes 21 and barrier layers 19.

Figure 6:
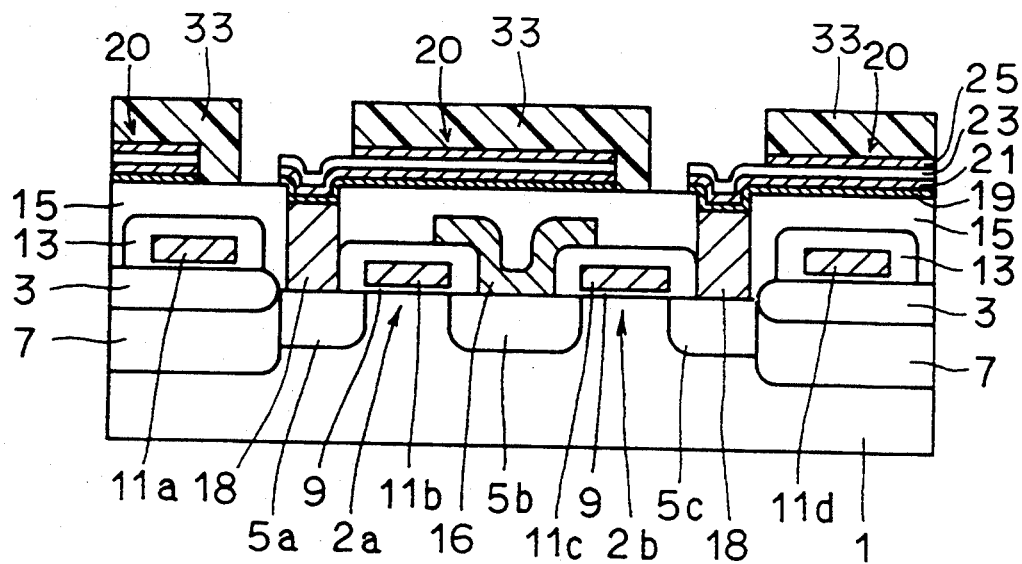

Referring to FIG. 6, resist patterns 33 are formed in shapes of capacitors 20, to expose portions of upper electrodes 25 which are positioned above upper surfaces of plugs 18. These resist patterns 33 are employed as masks to selectively etch upper electrodes 25 by dry etching, thereby removing the portions of upper electrodes 25 positioned above the upper surfaces of plugs 18. Thus, capacitors 20 are formed.

Figure 7:
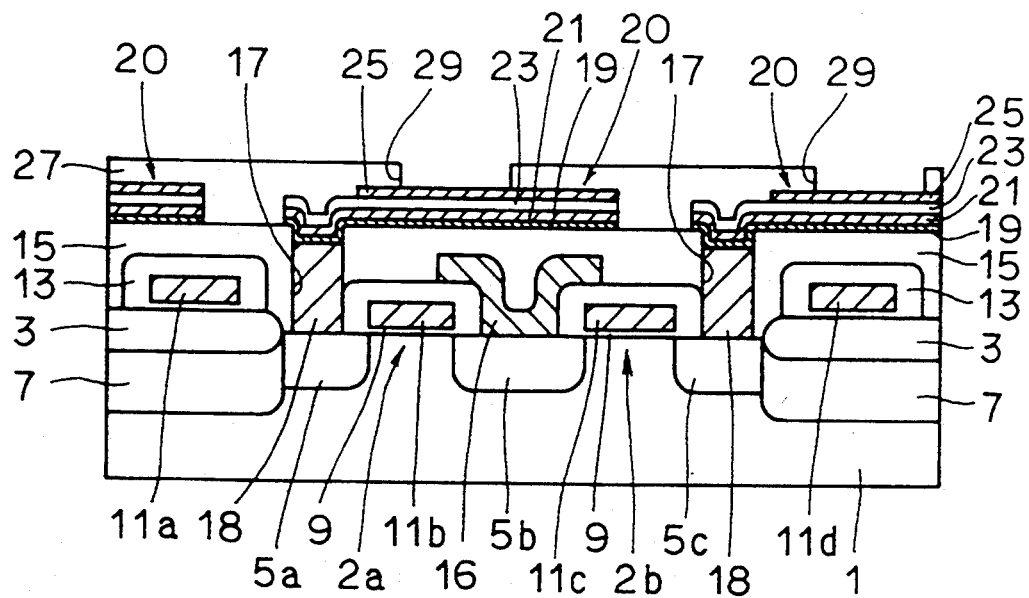

Referring to FIG. 7, a second interlayer insulating film 27 is formed to cover capacitors 20 by CVD or the like. Contact holes 29 are formed in portions of second interlayer insulating film 27 positioned on upper electrodes 25. An interconnection layer 31 is formed on inner surfaces of contact holes 29 and an upper surface of second interlayer insulating film 27 by sputtering or the like. The DRAM shown in FIG. 1 is formed through the aforementioned steps.

Figure 8:
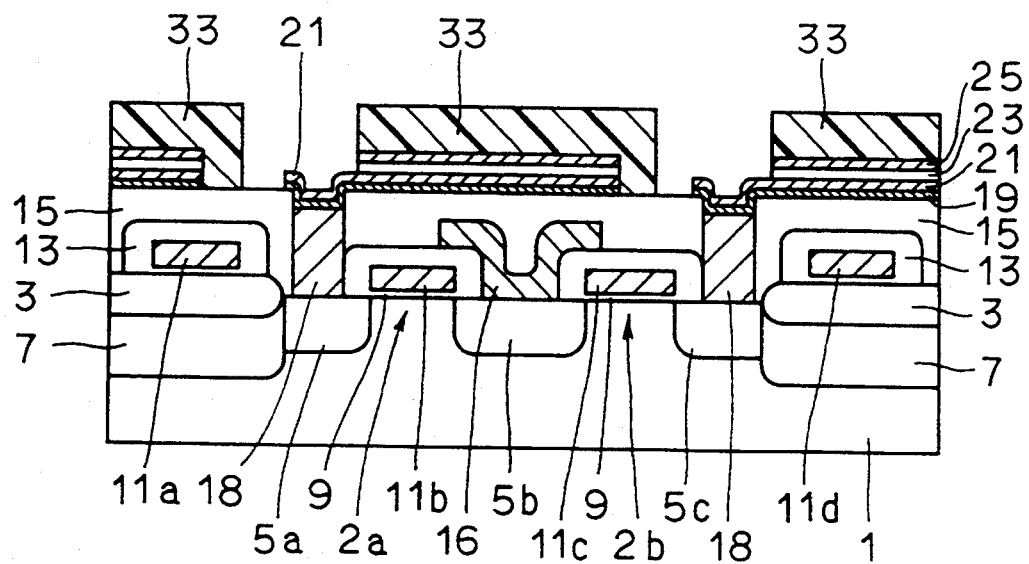
FIG. 8 is a sectional view showing a modification of the method of manufacturing the DRAM according to the first embodiment of the present invention.

Description is now made on a modification of the method of manufacturing the DRAM according to the first embodiment of the present invention. FIG. 8 is a sectional view showing the modification of the method according to the first embodiment of the present invention. While only upper electrodes 25 are selectively etched using resist patterns 33 serving as masks in the aforementioned method, high dielectric films 23 can also be selectively removed. In this case, high dielectric films 23 are only formed on lower electrodes 21 which are positioned on regions contact holes 17 are not formed.

(Second Embodiment)

Figure 9:
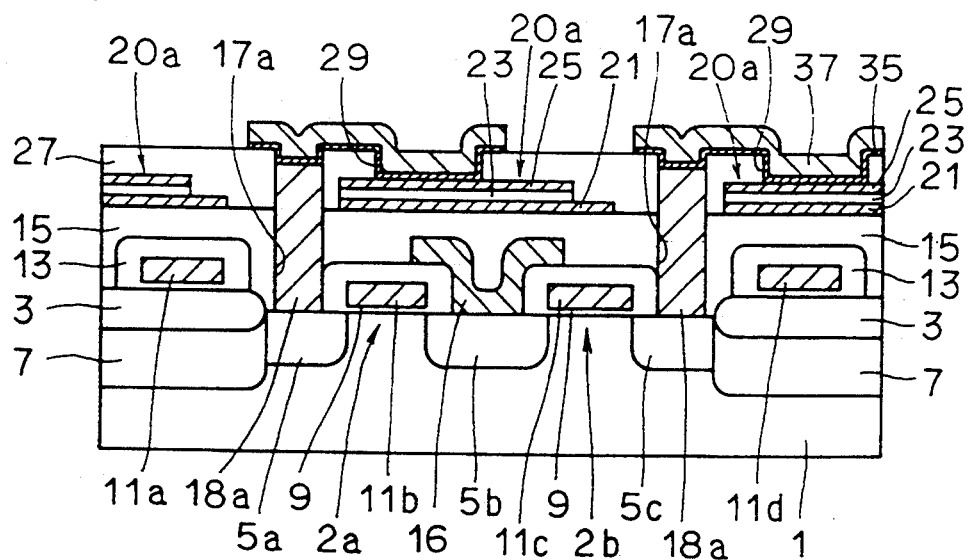
FIG. 9 is a sectional view showing a memory cell array part of a DRAM according to a second embodiment of the present invention.
Figure 10:
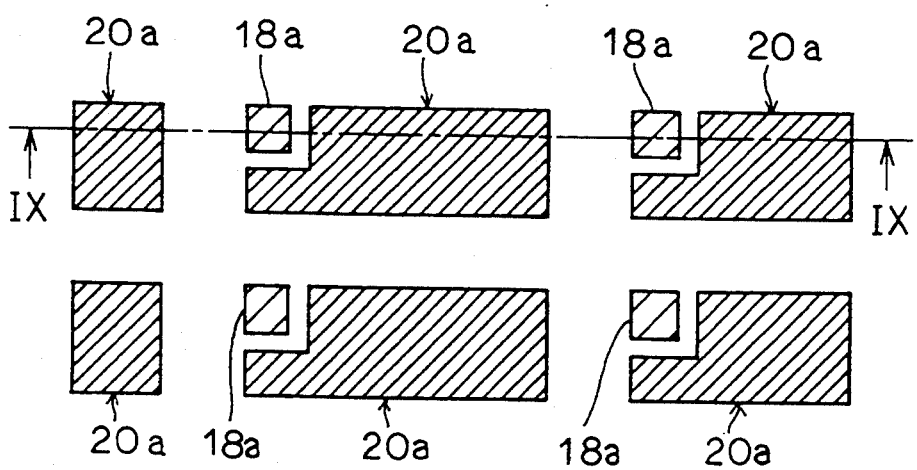
FIG. 10 is a plan view showing planar positional relation between plugs and capacitors in the second embodiment of the present invention.
Figure 11:
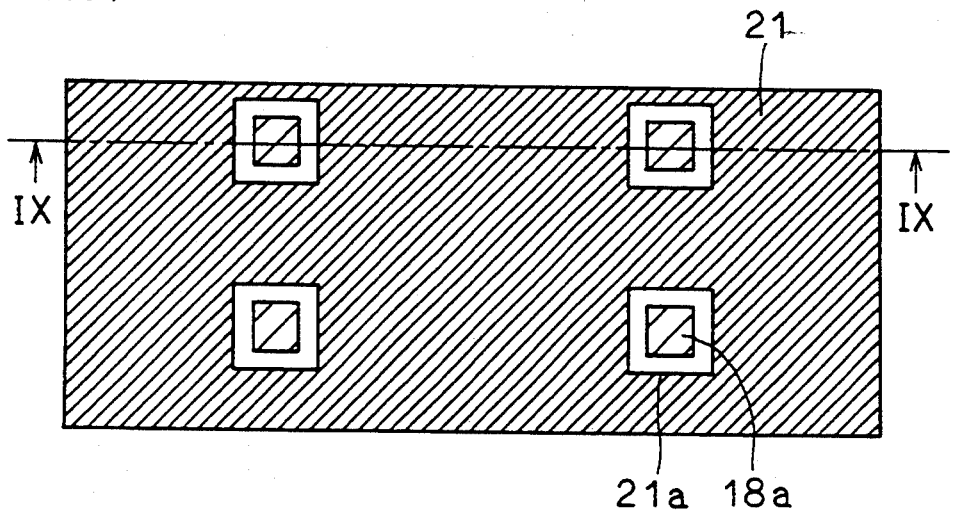
FIG. 11 is a plan view showing a planar structure of a lower electrode in the second embodiment of the present invention.

With reference to FIGS. 9 to 19, a DRAM according to a second embodiment of the present invention is now described. FIG. 9 is a partial sectional view showing a memory cell array part of the DRAM according to the second embodiment of the present invention. FIG. 10 is a plan view typically showing positional relation between plugs 18a and capacitors 20a provided in the second embodiment. FIG. 11 is a plan view showing the shape of a lower electrode 21 provided in the second embodiment.

With reference to FIGS. 9 to 11, the structure of the DRAM according to the second embodiment is now described.

While plugs 18 and lower electrodes 21 of capacitors 20 are electrically connected with each other in the first embodiment, upper electrodes 25 and plugs 18a are electrically connected with each other by an interconnection layer 37 in the second embodiment, as shown in FIG. 9. Namely, upper electrodes 25 and lower electrodes 21 are inverted with respect to the first embodiment. Such a structure brings the following effect:

When plugs 18 are made of polycrystalline silicon and lower electrodes 21 are made of platinum (Pt) in the first embodiment, these materials may react with each other to form platinum silicide upon high temperature heat treatment in the later step. Further, the materials forming high dielectric films 23, lower electrodes 21 and plugs 18 may be mutually diffused, as the case may be.

In order to prevent such mutual diffusion, it is necessary to provide barrier layers 19 between plugs 18 and lower electrodes 21. If the treatment temperature is too high, however, mutual diffusion is inevitably caused despite barrier layers 19. In more concrete terms, the possibility for mutual diffusion is increased if the treatment is carried out at a high temperature of at least 600° C. Further, oxygen may be permeated through barrier layers 19 to oxidize plugs 18.

In general, a step of forming the high dielectric films 23 is carried out at the highest temperature for the longest time among a step of forming capacitors and subsequent steps.

Figure 28:
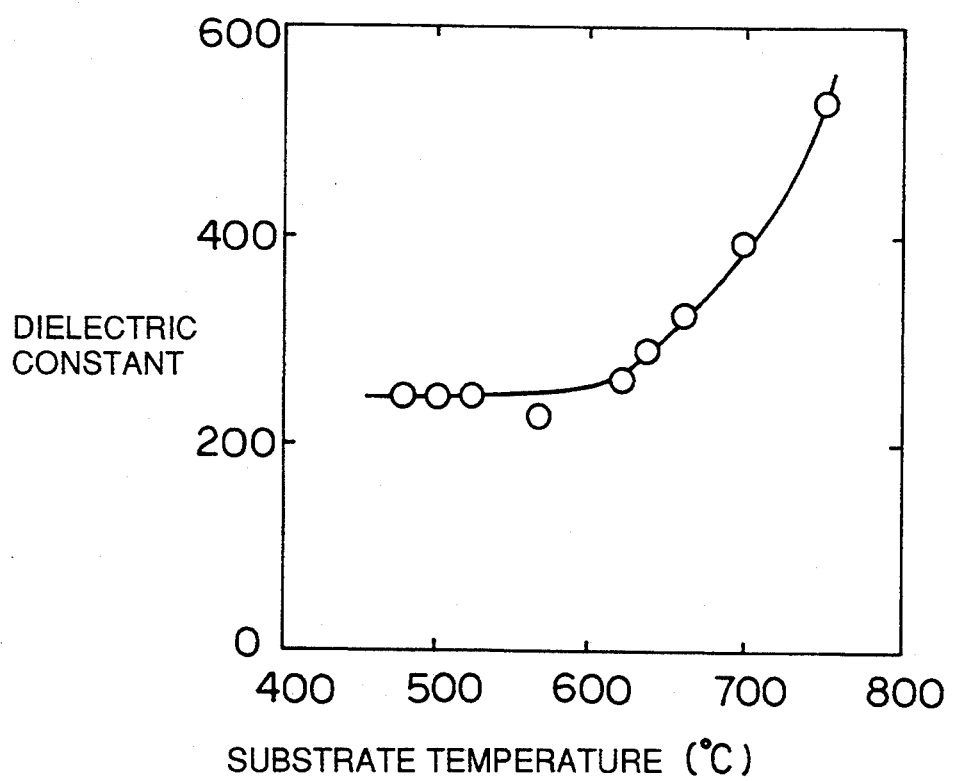
FIG. 28 illustrates relation between a dielectric constant of a high dielectric film and a formation temperature therefor.
Figure 29:
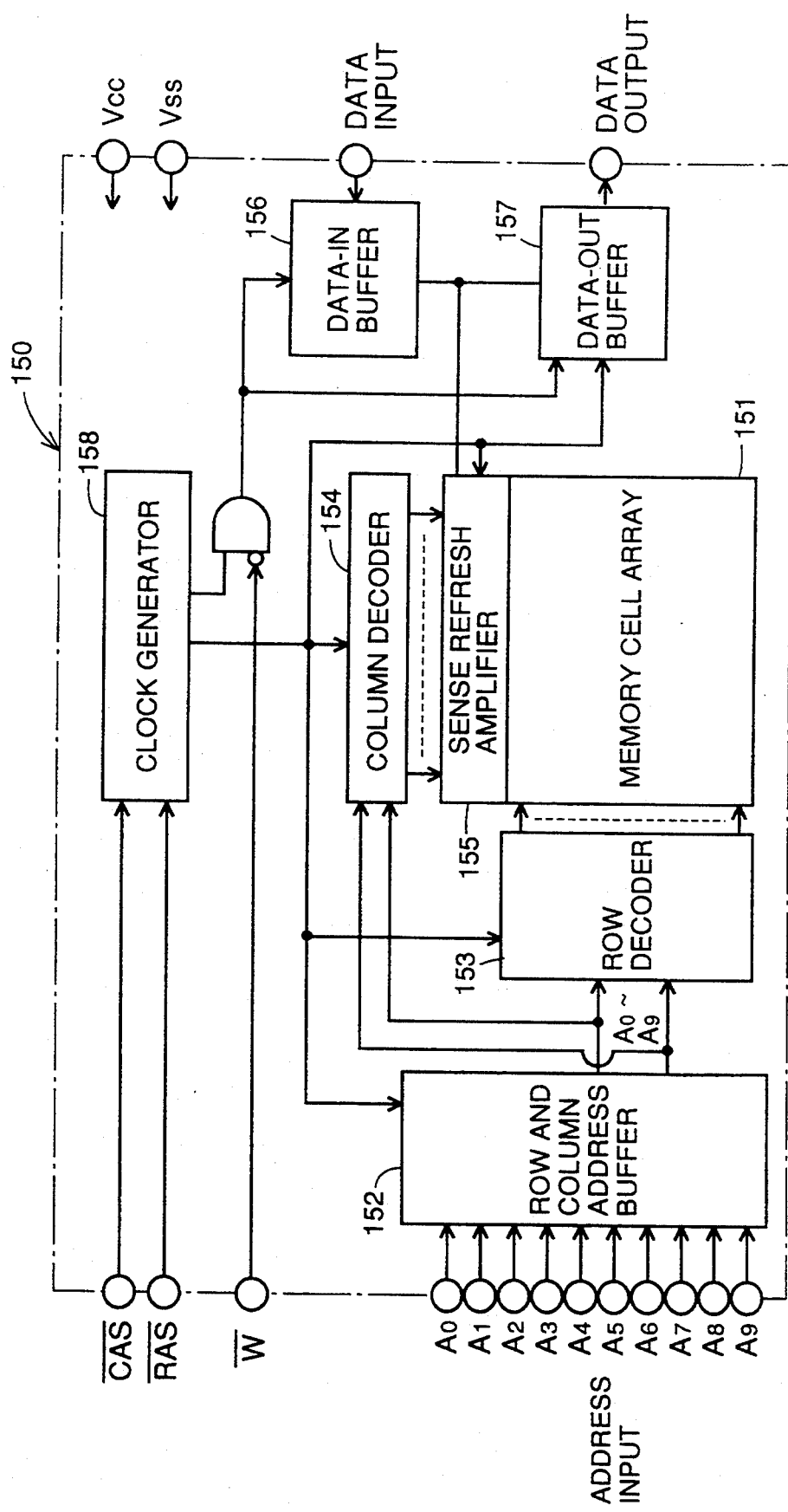
FIG. 29 is a block diagram showing a general structure of a conventional DRAM.
Figure 30:
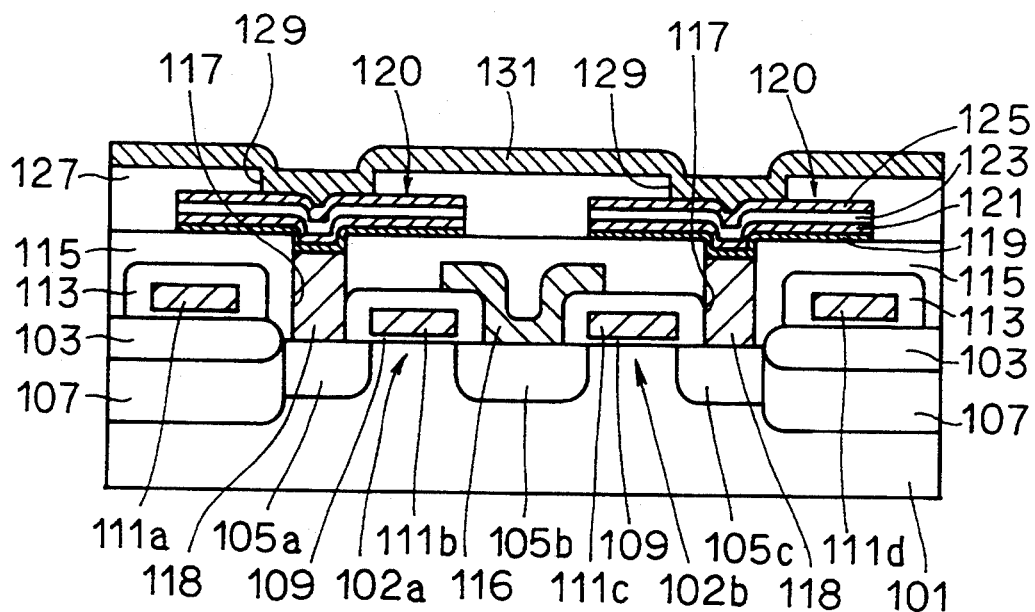
FIG. 30 is a sectional view showing an exemplary structure of a memory cell array part of the conventional DRAM.
Figure 31:
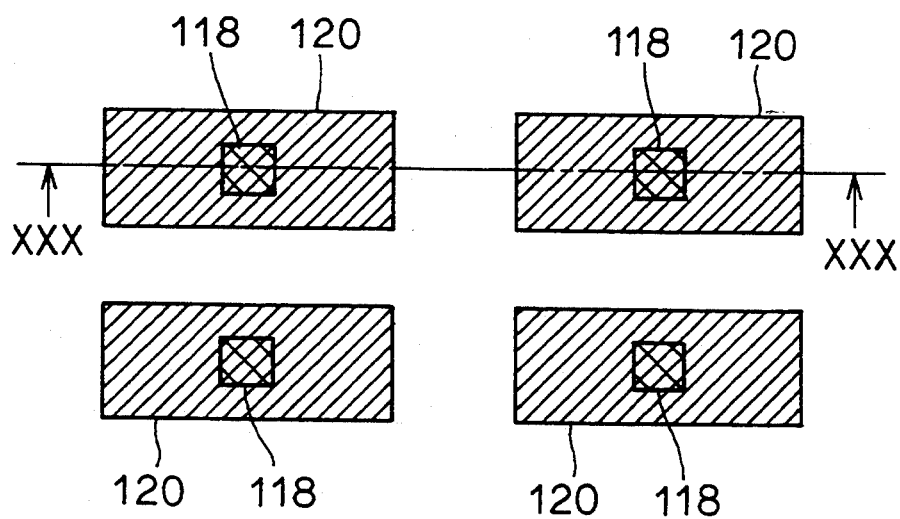
FIG. 31 is a plan view typically showing positional relation between plus and capacitors in the conventional DRAM.
Figure 32:
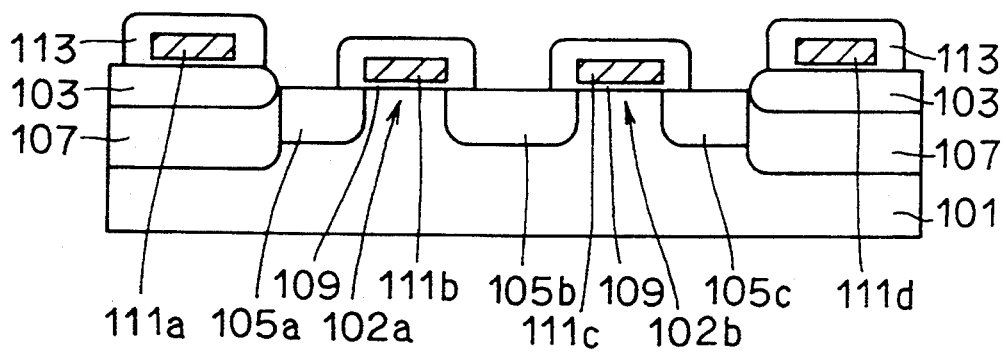
FIGS. 32 to 41 sectional views showing first to tenth steps of a method of manufacturing the conventional DRAM.
Figure 33:
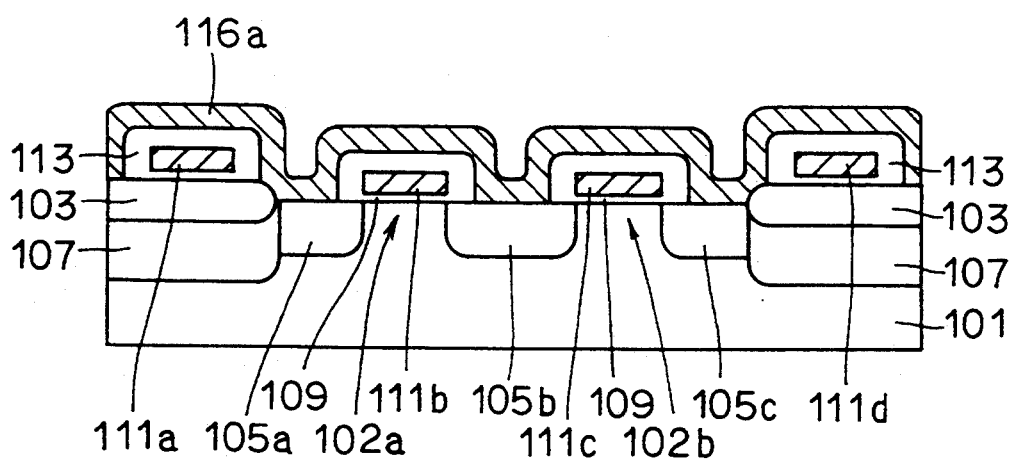
Figure 34:
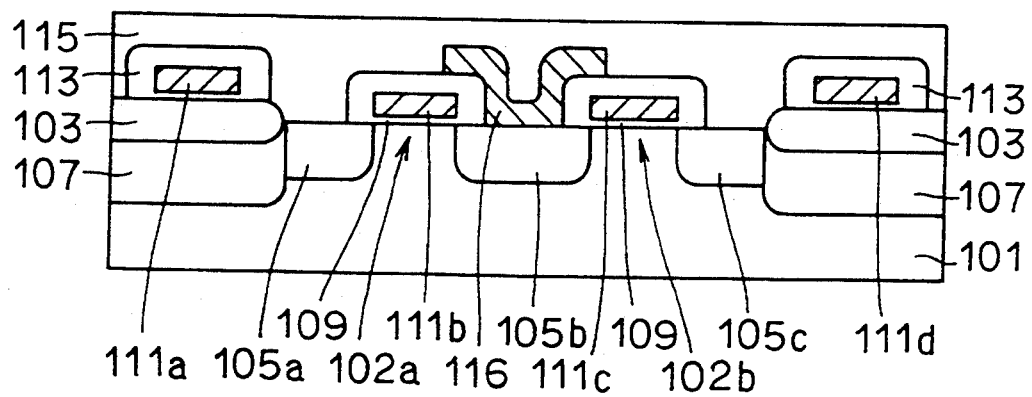
Figure 35:
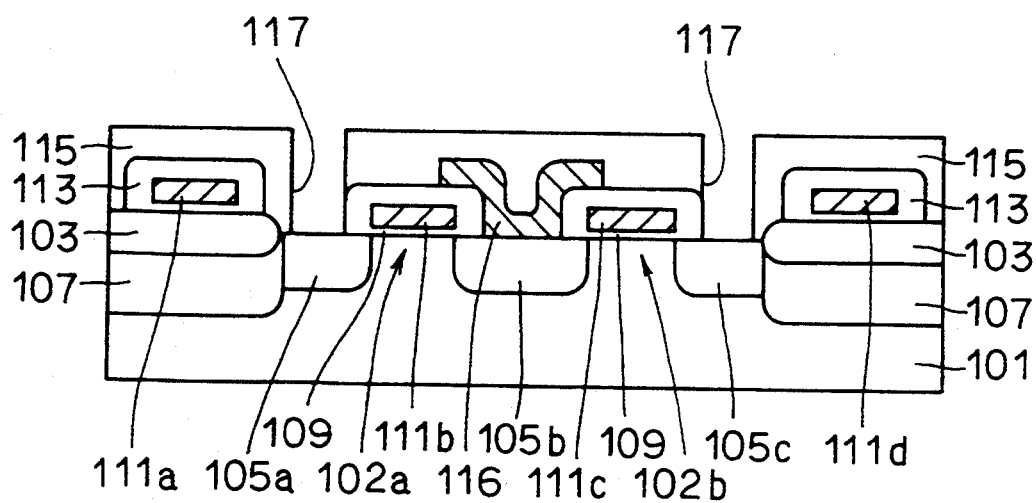
Figure 36:
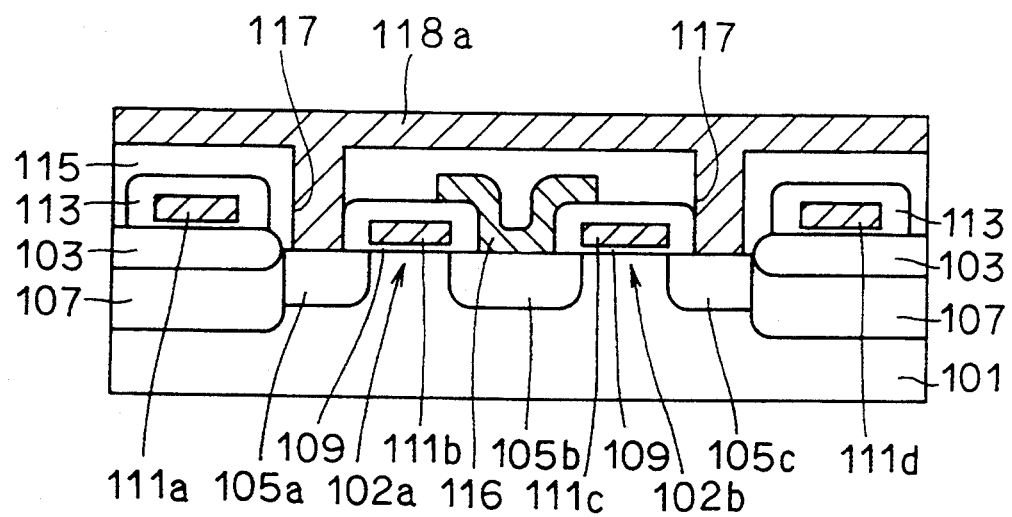
Figure 37:
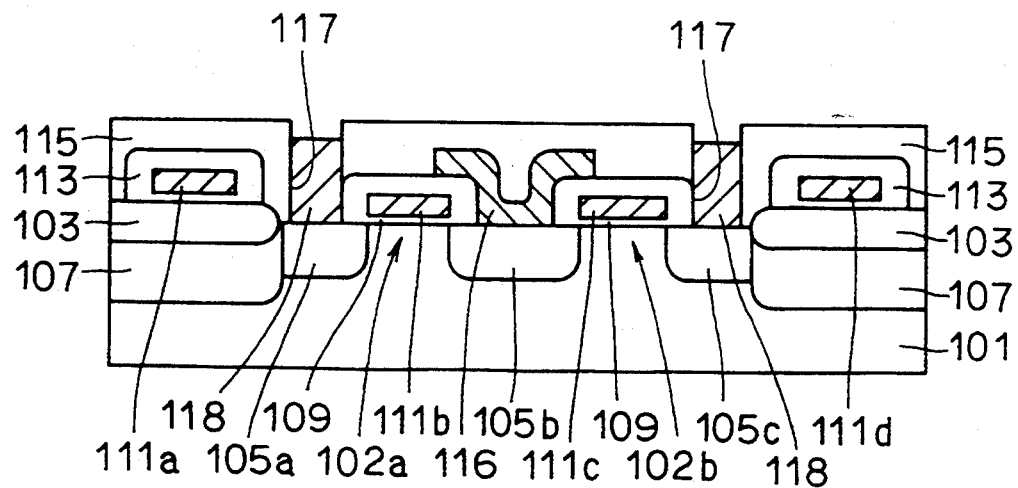
Figure 38:
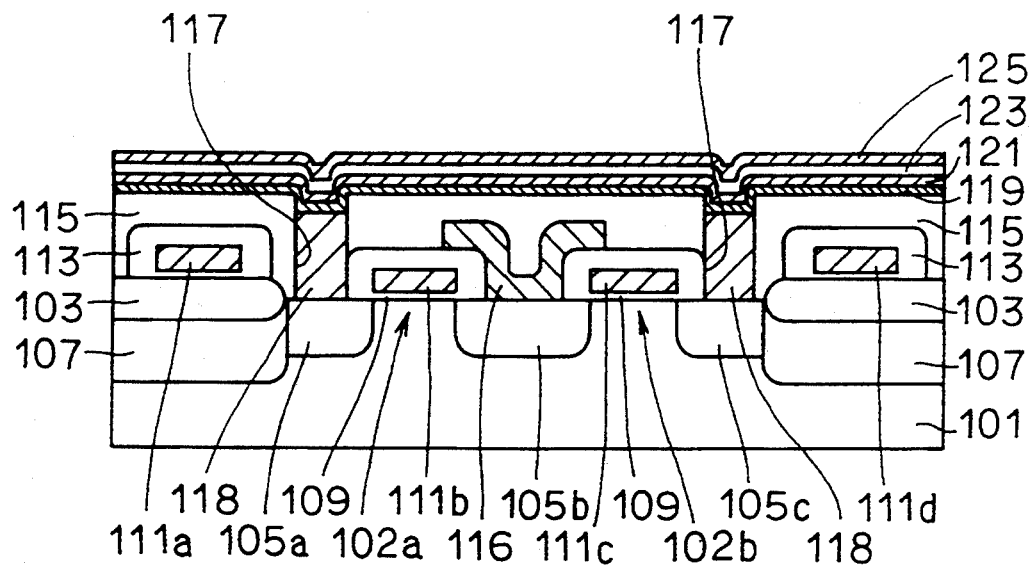
Figure 39:
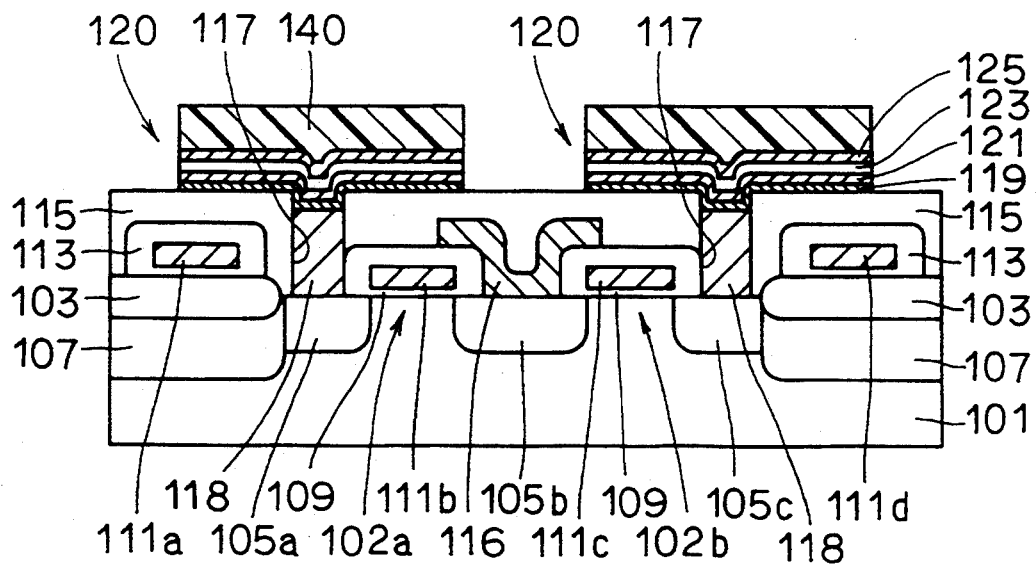
Figure 40:
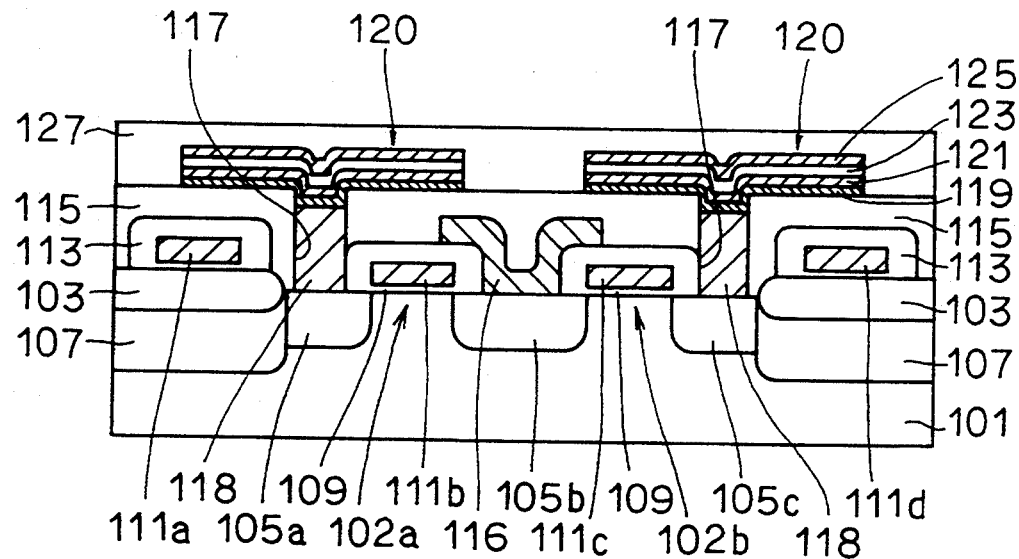
Figure 41:
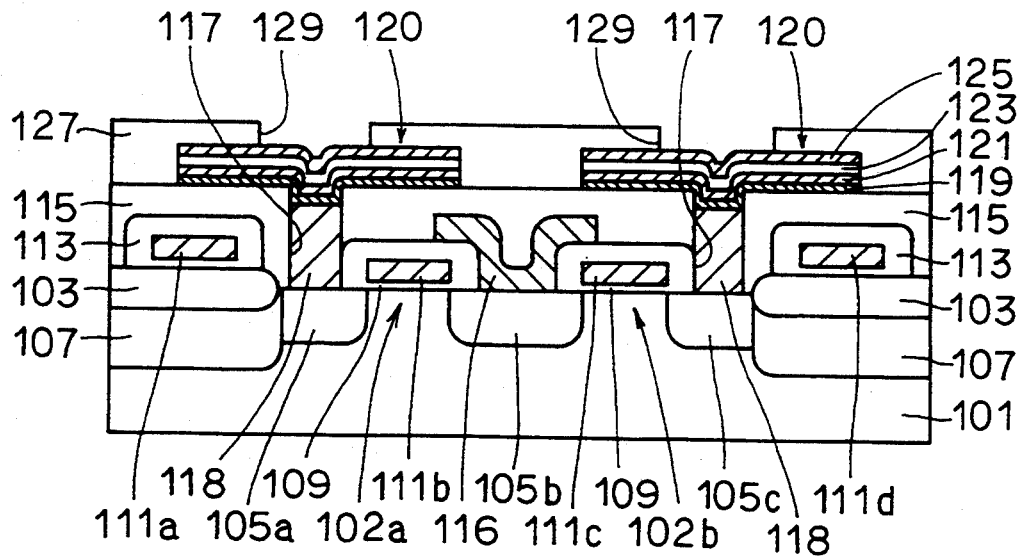
Figure 42:
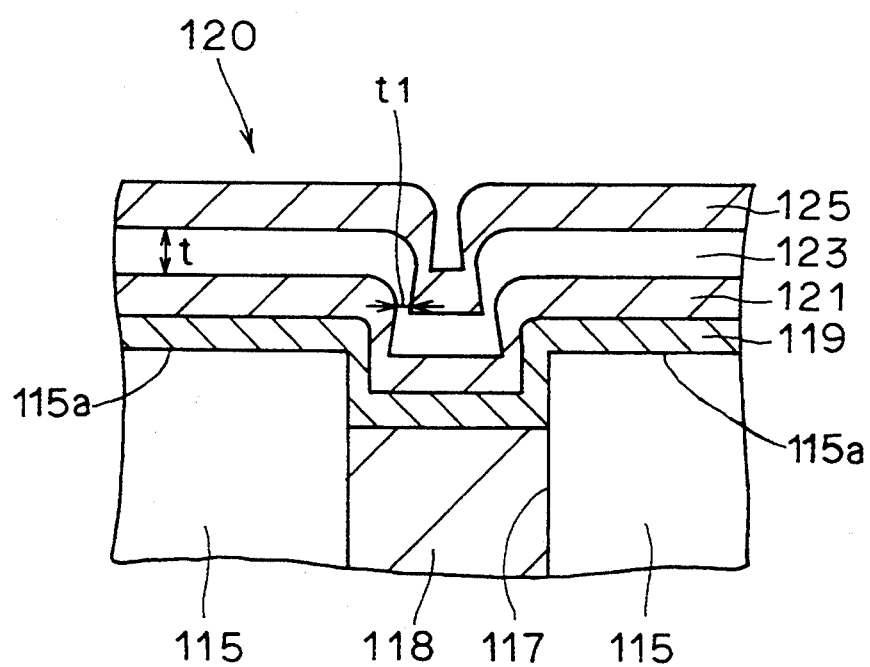
FIG. 42 is a sectional view showing connected portions of each plug and each capacitor in the conventional DRAM in an enlarged manner.

However, high dielectric films 23 are preferably treated at a high temperature of at least 600° C. to be improved in characteristics such as the dielectric constant, for example. FIG. 28 shows relation between a substrate temperature and a dielectric constant in formation of each high dielectric film 23 by sputtering. As shown in FIG. 28, the dielectric constant of high dielectric film 23 is improved by formation at a temperature of at least 600° C. In the prior art, however, it has been necessary to set the temperature for forming the high dielectric films 23 at a low level of not more than about 550° C., due to the problem of the aforementioned mutual diffusion and oxidation of plugs 18.

According to this embodiment, however, it is possible to electrically connect upper electrodes 25 and plugs 18a with each other by the interconnection layer 37 after formation of high dielectric films 23. Thus, it is possible to form high dielectric films 23 at a high temperature of at least 600° C., for example, with no necessity for consideration of reaction between lower electrode 21 and plugs 18a etc. Thus, it is possible to improve high dielectric films 23 in quality, thereby obtaining a device of high performance having high reliability.

As shown in FIG. 9, contact holes 17a are formed through first and second interlayer insulating films 15 and 27 in this embodiment, and plugs 18a are formed in these contact holes 17a. Further, all of lower electrode 21, high dielectric films 23 and upper electrodes 25 forming capacitors 20a are provided on an upper surface of first interlayer insulating film 15. Capacitors 20a are electrically connected with each other by lower electrode 21. Other structure of this embodiment is similar to that of the DRAM according to the first embodiment shown in FIG. 1.

With reference to FIG. 10, planar positional relation between plugs 18a and capacitors 20a is now described. Referring to FIG. 10, a section taken along the line IX—IX corresponds to that shown in FIG. 9.

Referring to FIG. 10, capacitors 20a are formed to avoid regions provided with plugs 18a, also in this embodiment. Thus, capacitors 20a are formed only on substantially flat portions of the upper surface of first interlayer insulating film 15. Therefore, it is possible to reduce high dielectric films 23 in thickness as compared with the prior art, similarly to the aforementioned first embodiment. Thus, it is possible to increase capacitances of capacitors 20a as compared with the prior art.

With reference to FIG. 11, the planar structure of lower electrode 21 is now described. Referring to FIG. 11, a section taken along the line IX—IX corresponds to that shown in FIG. 9. Referring to FIG. 11, openings 21a are formed in lower electrode 21 on regions provided with plugs 18a. The capacitors 20a are electrically connected with each other by the lower electrode 21.

With reference to FIGS. 12 to 19, a method of manufacturing the DRAM according to the second embodiment is now described. FIGS. 12 to 19 are partial sectional views showing fourth to eleventh steps of the method of manufacturing the DRAM according to the second embodiment of the present invention. First to third steps of this embodiment are similar to those of the prior art, and hence redundant description is omitted.

Figure 12:
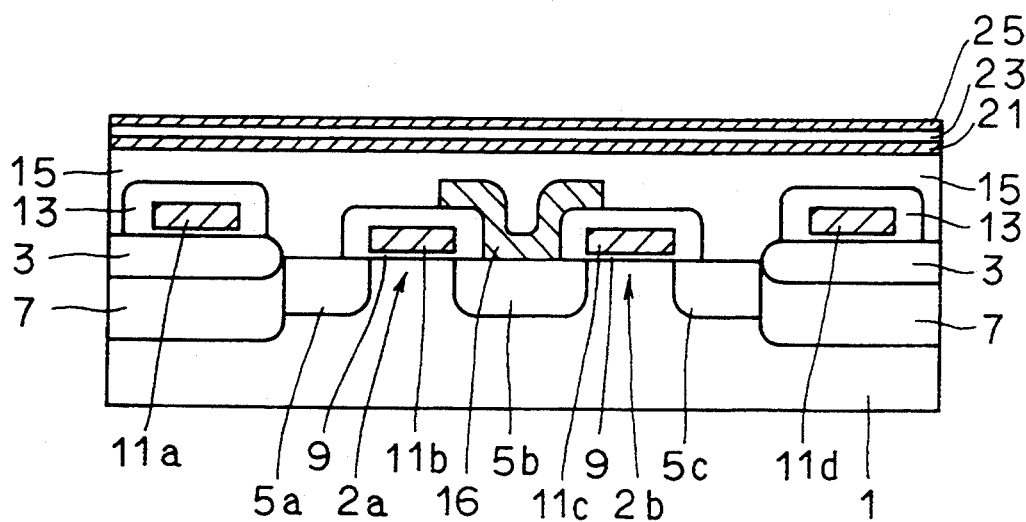
FIGS. 12 to 19 are sectional views showing fourth to eleventh steps o method of manufacturing the DRAM according to the second embodiment of the present invention.

Referring to FIG. 12, elements up to a first interlayer insulating layer 15 are formed through steps similar to those of the prior art. An upper surface of first interlayer insulating film 15 is flattened by combination of an SOG technique and overall etching or the like. Lower electrode 21 is formed on the flattened first interlayer insulating film 15 by sputtering or the like. Lower electrode 21 can be made of platinum (Pt) or the like. The lower electrode 21 is similar in thickness to that of the first embodiment.

Then, a high dielectric film 23 is formed on lower electrode 21 by reactive sputtering or LPCVD. The material and thickness of high dielectric film 23 is similar to that of the first embodiment. Then, an upper electrode 25 is formed on high dielectric film 23 by sputtering or the like. Upper electrode 25 can be made of platinum (Pt) or the like. Upper electrode 25 is also similar in thickness to that in the first embodiment.

At this time, plugs 18a are not yet formed in formation of high dielectric film 23, dissimilarly to the first embodiment. Therefore, it is not necessary to consider mutual diffusion between plugs 18a and lower electrode 21 or upper electrode 25, dissimilarly to the first embodiment. Thus, it is possible to form high dielectric film 23 at a high temperature of at least 600° C., thereby obtaining the polycrystalline high dielectric film 23 having excellent film quality, with a high dielectric constant and a small leakage current.

Figure 13:
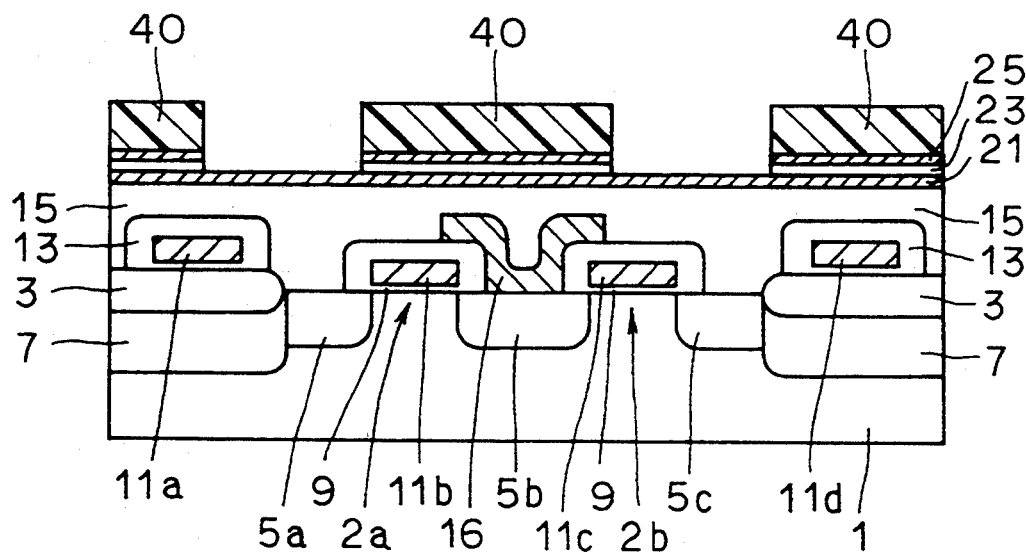

Referring to FIG. 13, resist patterns 40 which are patterned in shapes of capacitors 20a are formed on upper electrode 25. These resist patterns 40 are employed as masks to selectively etch upper electrode 25 and high dielectric film 23. Thereafter resist patterns 40 are removed.

Figure 14:
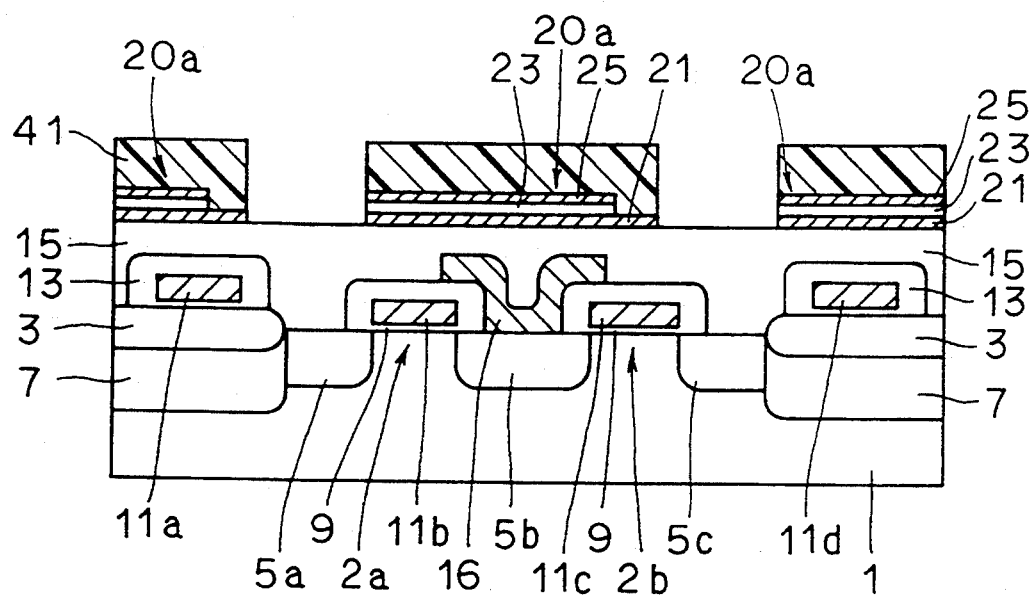

Referring to FIG. 14, resist patterns 41 having openings on regions to be provided with plugs 18a are formed on upper and lower electrodes 25 and 21. Resist patterns 41 are employed as masks to carry out etching, thereby patterning lower electrode 21. Thus, lower electrode 21 having the planar shape shown in FIG. 11 is formed, thereby defining capacitors 20a on first interlayer insulating film 15. Due to the aforementioned structure of lower electrode 21, capacitors 20a are electrically interconnected with each other by lower electrode 21.

Figure 15:
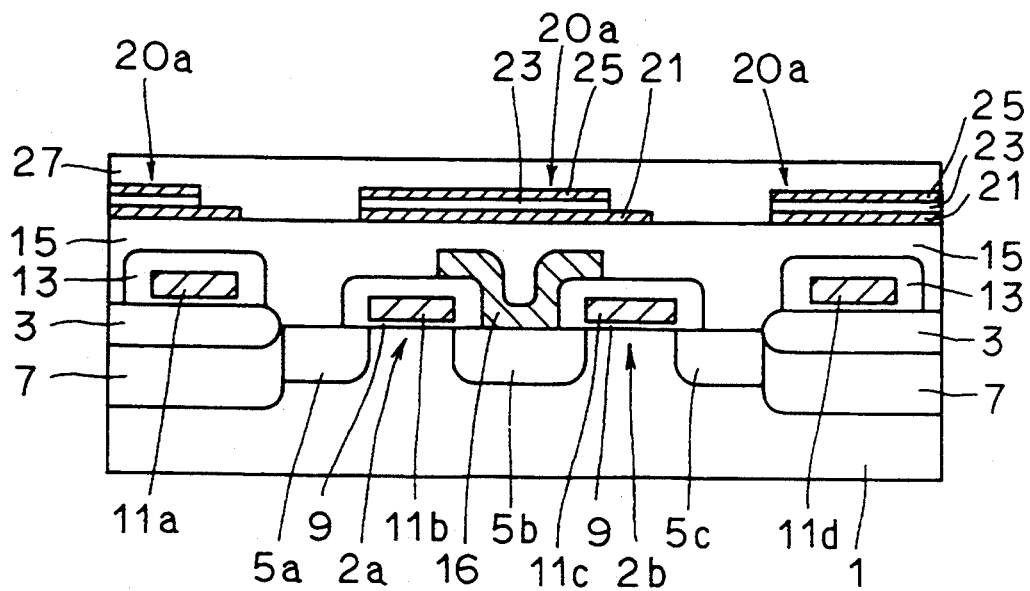
Figure 16:
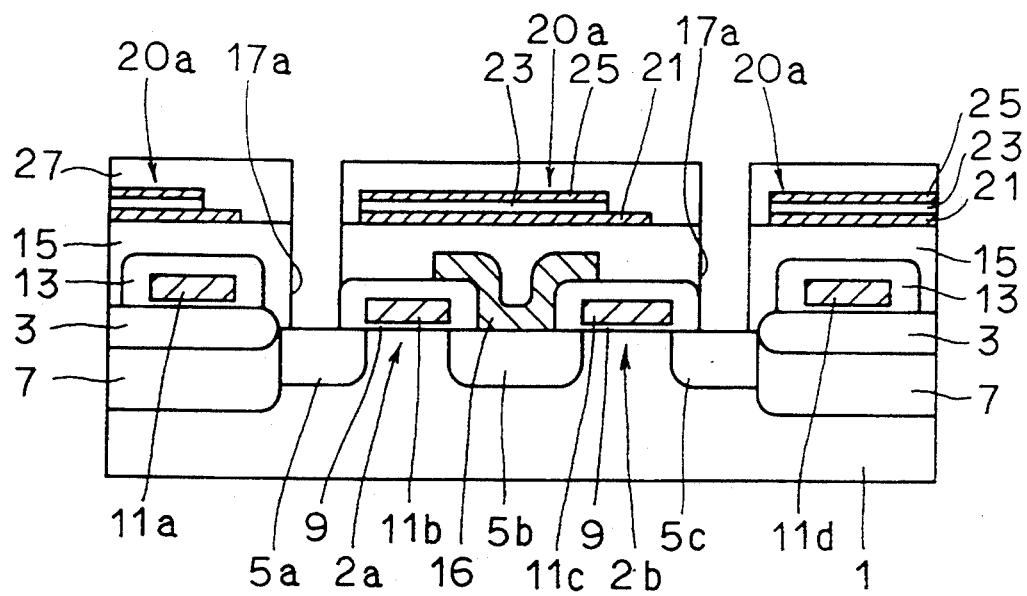

Referring to FIG. 15, a second interlayer insulating film 27 is formed by CVD or the like, to cover capacitors 20a. As shown in FIG. 16, contact holes 17a are formed in first and second interlayer insulating films 15 and 27 to reach surfaces of impurity regions 5a and 5c.

Figure 17:
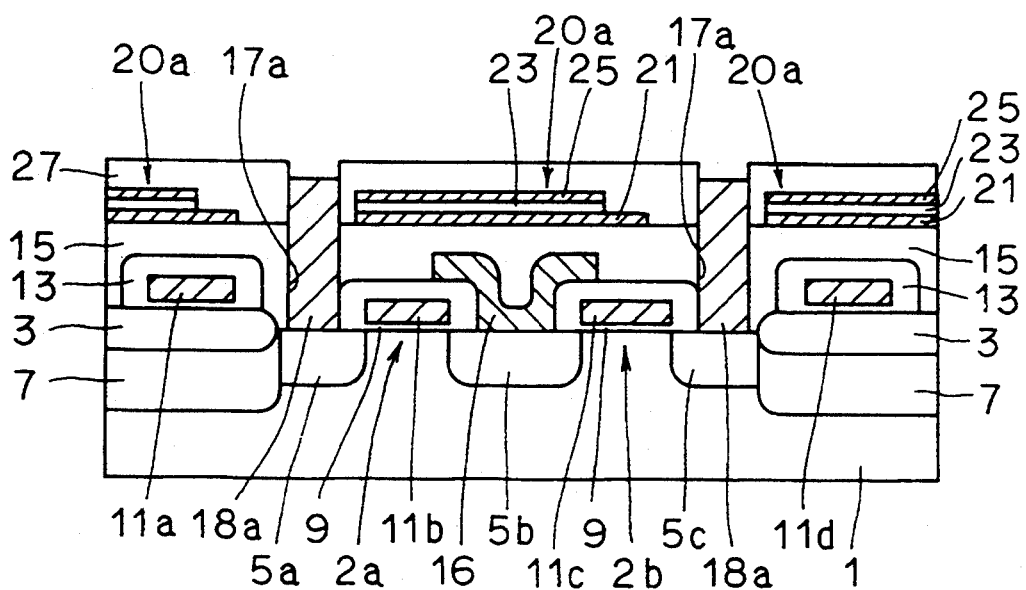

Referring to FIG. 17, a conductive layer of polycrystalline silicon or the like is formed on inner surfaces of contact holes 17a and an upper surface of second interlayer insulating film 27, by CVD or the like. Then, this conductive layer is etched back, thereby forming plugs 18a in contact holes 17a.

At this time, overetching treatment is performed so that the conductive layer is not left on the upper surface of second interlayer insulating film 27. Thus, upper surfaces of plugs 18a are lower in contact holes 17a. Plugs 18a may be made of TiN or the like.

Figure 18:
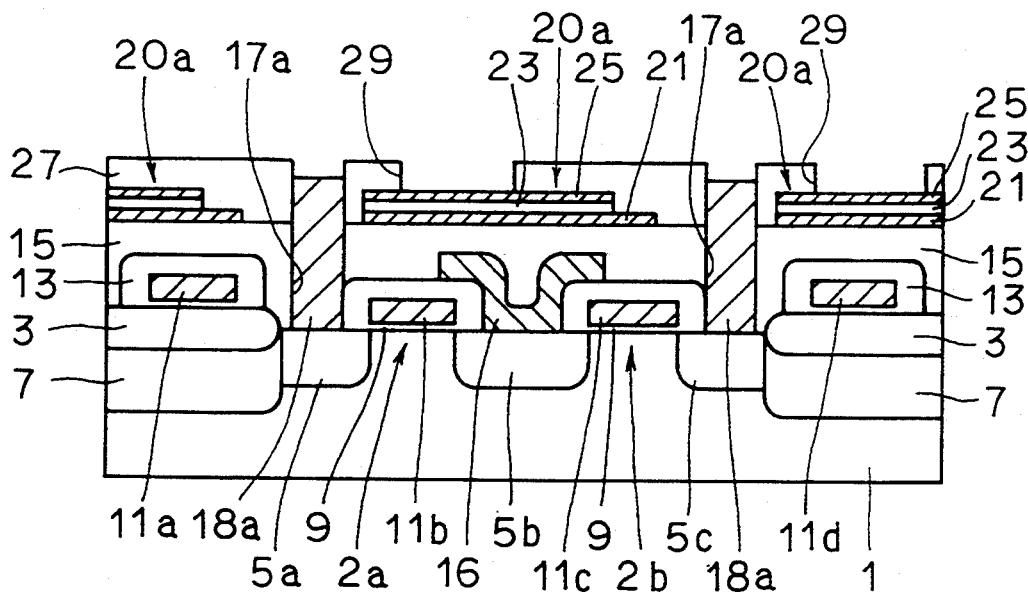
Figure 19:
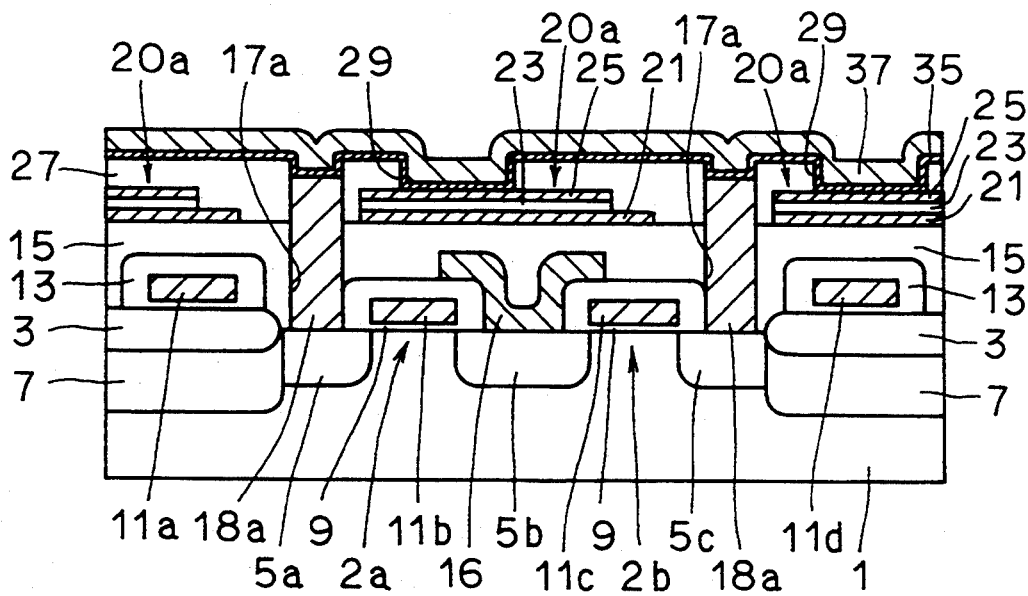

Referring to FIG. 18, contact holes 29 are formed in second interlayer insulating film 27 in portions located on upper electrodes 25. Referring to FIG. 19, a barrier layer 35 is formed on upper surfaces of plugs 18a, inner surfaces of contact holes 29 and the upper surface of second interlayer insulating film 27. Barrier layer 35 can be made of TiN or the like.

An interconnection layer 37 is formed on barrier layer 35, by sputtering or the like. Interconnection layer 37 and barrier layer 35 are patterned in prescribed shapes. Thus, interconnection layer 37 electrically connecting plugs 18a and upper electrodes 25 of capacitors 20a with each other is formed as shown in FIG. 9. The DRAM shown in FIG. 9 is formed through the aforementioned steps.

(Third Embodiment)

Figure 20:
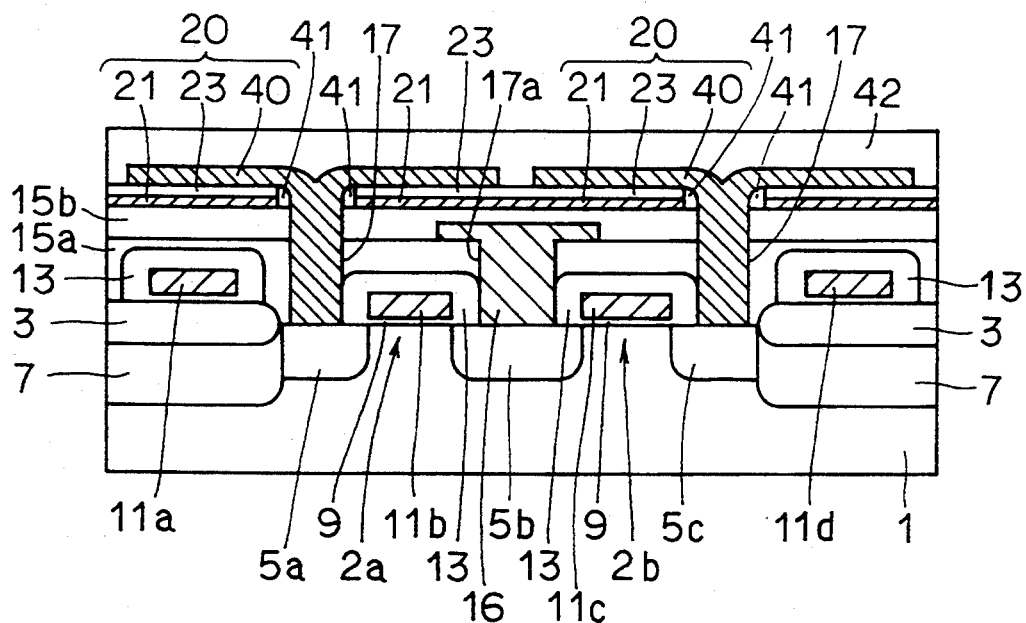
FIG. 20 is a partial sectional view showing a memory cell array part of a DRAM according to a third embodiment of the present invention.
Figure 21:
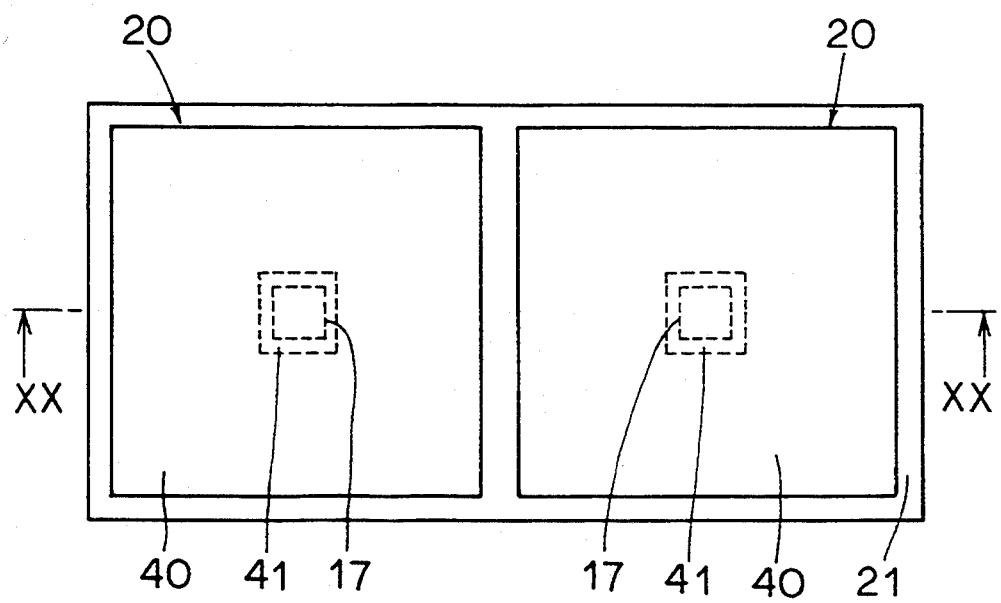
FIG. 21 is a plan view of the DRAM according to the third embodiment shown in FIG. 20.

With reference to FIGS. 20 to 27, a third embodiment of the present invention is now described. FIG. 20 is a partial sectional view showing a memory cell array part of a DRAM according to the third embodiment of the present invention. FIG. 21 is a plan view of the DRAM shown in FIG. 20.

Referring to FIG. 20, a first interlayer insulating film 15 is formed by interlayer insulating films 15a and 15b of about 3000 Å to about 10000 Å in thickness. A capacitor lower electrode 21 is formed on an upper surface of interlayer insulating film 15b excluding portions located on contact holes 17, and a high dielectric film 23 is formed on an upper surface of capacitor lower electrode 21. Capacitor upper electrodes 40 also serving as plug electrodes 18 are formed extending from contact holes 17 onto a surface of high dielectric film 23. Capacitor upper electrodes 40 may be made of TiN or the like.

Side wall insulating films 41 are formed on upper corner portions of contact holes 17 for isolating capacitor upper electrodes 40 and capacitor lower electrode 21 from each other. Side wall insulating films 41 can be formed by insulating films such as silicon nitride films. A second interlayer insulating film 42 is formed to cover capacitor upper electrodes 40. Second interlayer insulating film 42 may be made of silicon oxide film or the like. Other structure of this embodiment is similar to that of the DRAM according to the first embodiment shown in FIG. 1.

Capacitor upper electrodes 40 also serve as plug electrodes 18 as described above, whereby it is possible to omit a step of forming plug electrodes 18. Thus, the manufacturing cost can be reduced.

Since it is possible to omit formation of plug electrodes 18, it is not necessary to form barrier layers between plug electrodes 18 and upper or lower electrodes of capacitors 20 for preventing mutual diffusion of the materials of plug electrodes 18 and the electrodes of capacitors 20. Thus, it is possible to reduce the height of the memory cell array part as compared with those in the aforementioned embodiments. Thus, it is possible to suppress a step between the memory cell array part and a peripheral circuit part.

Due to the aforementioned structure of capacitor upper electrodes 40, it is possible to form capacitor upper electrodes 40 also serving as plugs after formation of high dielectric film 23. Thus, it is possible to form high dielectric film 23 at a high temperature of at least 600° C. similarly to the second embodiment, thereby forming high dielectric film 23 with excellent characteristics.

With reference to FIG. 21, the planar structure of the memory cell array part in the DRAM according to this embodiment is now described. Referring to FIG. 21, capacitor lower electrode 21 is formed on the overall upper surface of interlayer insulating film 15b except portions provided with contact holes 17. Namely, the capacitor lower electrode 21 has a function as a cell plate electrode. Further, high dielectric film 23 (not shown) is formed on the overall upper surface of capacitor lower electrode 21. Side wall insulating films 41 of silicon nitride films or the like are formed on the upper corner portions of contact holes 17, to enclose contact holes 17. Capacitor upper electrodes 40 are formed to extend from contact holes 17 toward an upper portion of capacitor lower electrode 21. Thus, capacitors 20 are formed only on upper surface portions of interlayer insulating film 15b except portions located on contact holes 17 to enclose contact holes 17, thereby attaining an effect similar to that of the first embodiment.

With reference to FIGS. 22 to 27, a method of manufacturing the memory cell array part of the DRAM according to this embodiment is now described. FIGS. 22 to 27 are partial sectional views showing fourth to ninth steps of manufacturing the DRAM according to this embodiment.

Figure 22:
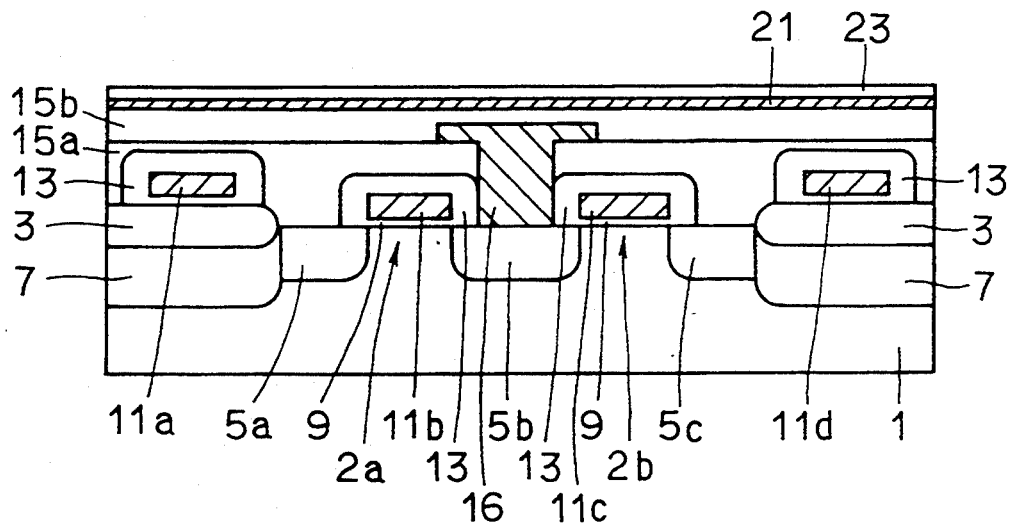
FIGS. 22 to 27 are sectional views showing fourth to ninth steps of a method of manufacturing the DRAM according to the third embodiment of the present invention.

Referring to FIG. 22, elements up to oxide films 13 are formed through steps similar to those of the first embodiment. An interlayer insulating film 15a of silicon oxide or the like is formed by CVD or the like, to cover oxide films 13. A contact hole 17a is formed in this interlayer insulating film 15a to reach a surface of an impurity region 5b, and a buried bit line 16 is formed in this contact hole 17a. An interlayer insulating film 15b of silicon oxide or the like is formed on interlayer insulating film 15a by CVD or the like, to cover buried bit line 16. An upper surface of interlayer insulating film 15b is flattened.

A capacitor lower electrode 21 of Pt or the like is formed on the flattened upper surface of interlayer insulating film 15b, by sputtering or the like. At this time, a conductive film of Ti or the like or an insulating film may be interposed between capacitor lower electrode 21 and interlayer insulating film 15b for improving adhesion therebetween, if necessary.

Then, a high dielectric film 23 is formed on capacitor lower electrode 21 by reactive sputtering or the like, at a temperature higher than 550° C., preferably at about 600° to 700° C. At this time, interlayer insulating film 15b serves as an underlayer for capacitor lower electrode 21, whereby it is possible to form high dielectric film 23 at high temperature. Thus, it is possible to reliably form the polycrystalline high dielectric film 23 which is improved in characteristics such as the dielectric constant. Consequently, it is possible to increase the capacitances of the capacitors, as well as to improve reliability thereof.

High dielectric film 23 may alternatively be formed by LPCVD (low pressure chemical vapor deposition). Alternatively, an amorphous high dielectric film 23 may be formed by reactive sputtering or the like, so that high dielectric film 23 is thereafter polycrystallized by lamp annealing, preferably under conditions of at least 600° C. and about 30 seconds.

Figure 23:
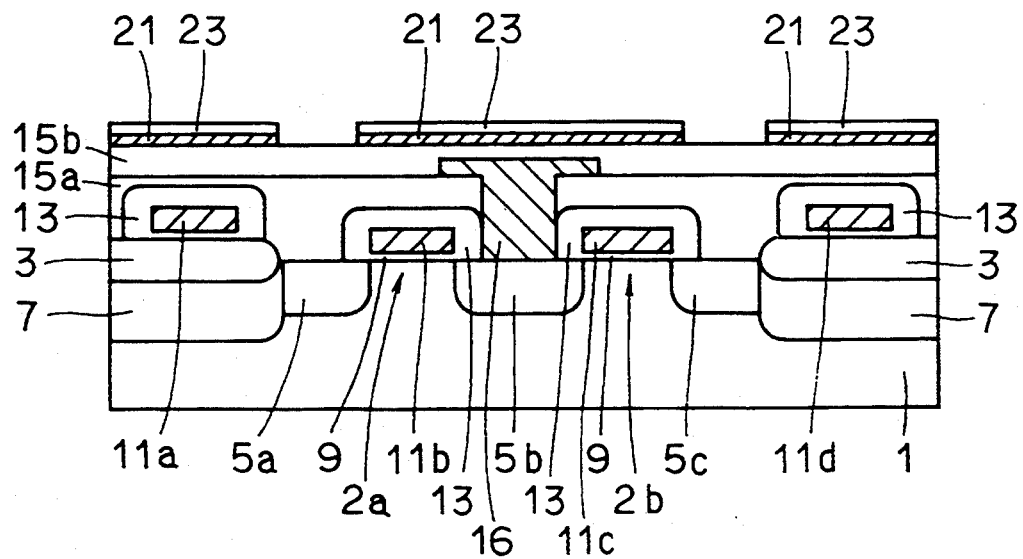

Referring to FIG. 23, high dielectric film 23 and the capacitor lower electrode 21 are patterned in prescribed shapes. In more concrete terms, high dielectric film 23 and capacitor lower electrode 21 are patterned to expose the surface portions of interlayer insulating film 15b to be provided with contact holes 17 shown in FIG. 20.

Figure 24:
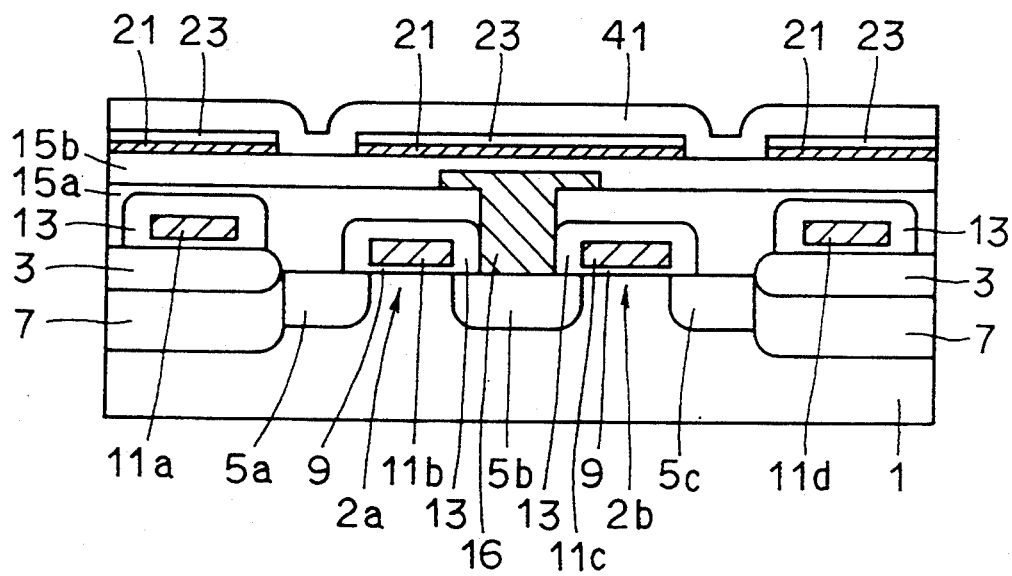

Referring to FIG. 24, a silicon nitride film 41 of about 1000 to 2000 Å in thickness is formed on interlayer insulating film 15b by CVD or the like, to cover high dielectric film 23. This silicon nitride film 41 may alternatively be made of a material other than silicon nitride, so far as the same is made of an insulating material which is different from that for interlayer insulating film 15. Such another material for silicon nitride film 41 can be prepared from an insulating material which can ensure a high etching selection ratio with respect to the material for interlayer insulating film 15.

Figure 25:
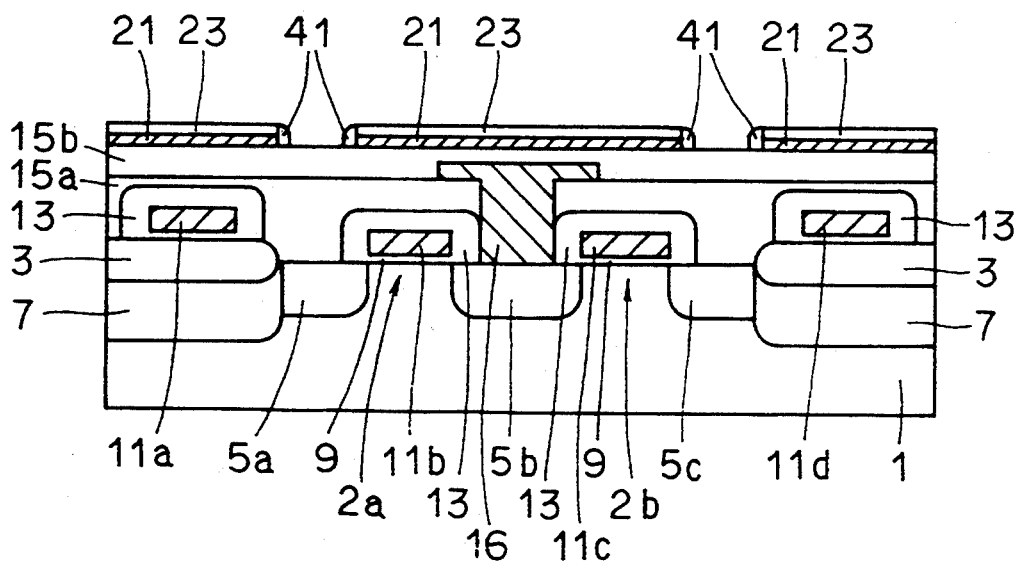
Figure 26:
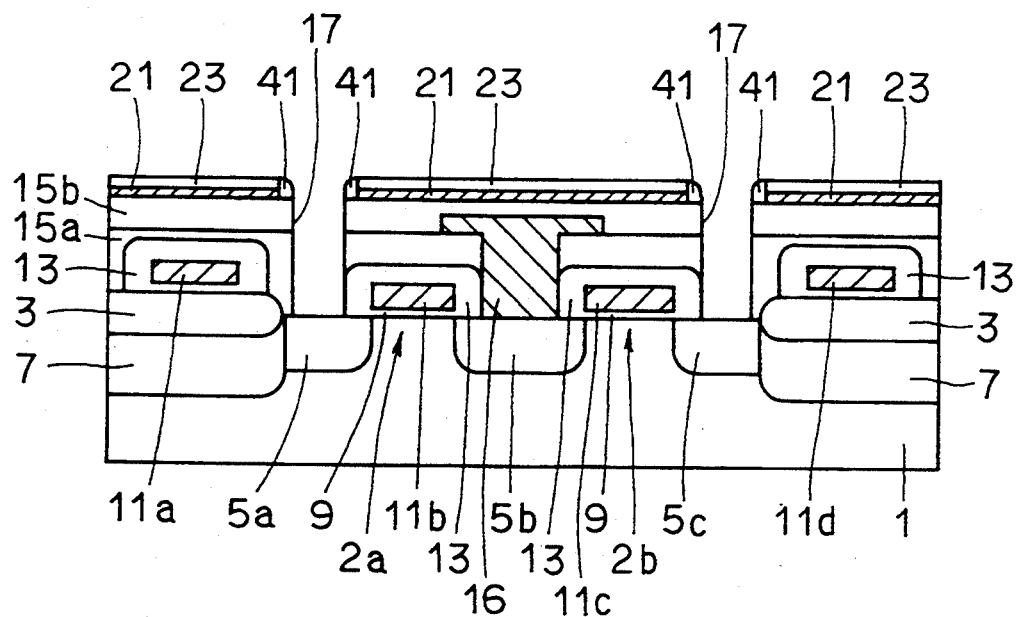

Referring to FIG. 25, anisotropic etching is performed on silicon nitride film 41, to form side wall insulating films 41. Side wall insulating films 41 and high dielectric film 23 are employed as masks to perform anisotropic etching on the interlayer insulating films 15a and 15b, thereby forming contact holes 17 reaching impurity regions 5a and 5c.

Figure 27:
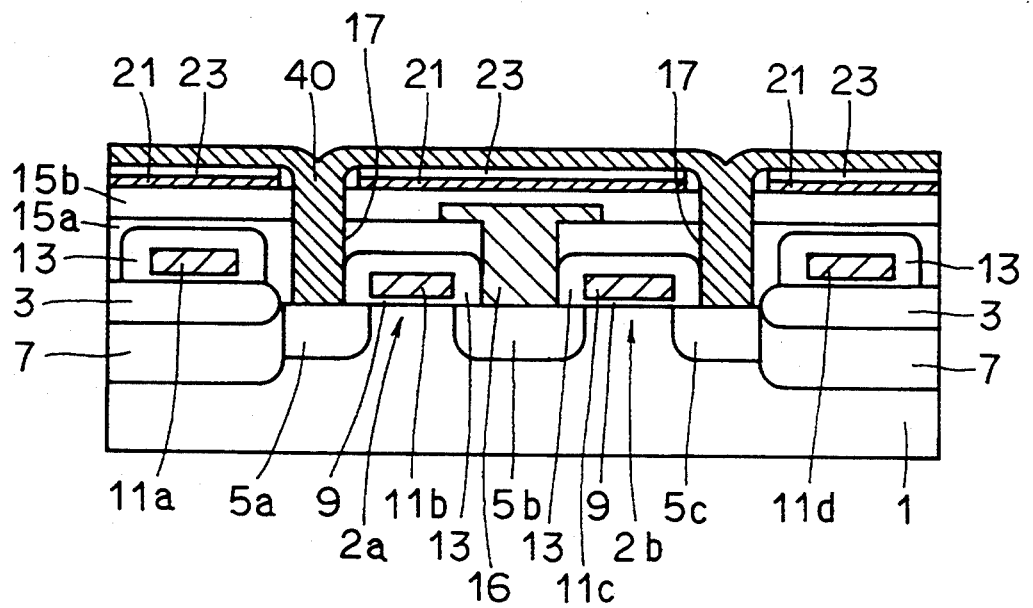

Referring to FIG. 27, a TiN layer 40 is deposited on the overall surface by CVD or the like. The material for this layer 40 is not restricted to TiN, so far as the same will not react with high dielectric film 23 to form a film of a low dielectric constant. For example, the layer 40 may alternatively be made of Pt or $RuO_2$.

Then, the TiN layer 40 is patterned through photolithography and anisotropic etching by RIE (reactive ion etching), thereby forming capacitor upper electrodes 40 having the shapes shown in FIG. 20. Due to such shapes of capacitor upper electrodes 40, it is not necessary to form plug electrodes for electrically connecting the upper or lower electrodes of capacitors 20 and impurity regions 5a and 5c with each other, thereby simplifying the manufacturing steps. Due to omission of formation of such plug electrodes, further, it is not necessary to form diffusion barrier layers to be interposed between the electrodes of capacitors 20 and the plug electrodes.

After capacitor upper electrodes 40 are formed in the aforementioned manner, a second interlayer insulating film 42 of silicon oxide or the like is formed by CVD or the like. The DRAM according to this embodiment is formed through the aforementioned steps, as shown in FIG. 20.

According to the present invention, as hereinabove described, it is possible to form capacitors only on flat regions of the upper surface of the interlayer insulating film. Consequently, it is possible to substantially flatten the upper surfaces of the first electrodes in the capacitors. The high dielectric films are formed on the flat upper surfaces of the first electrodes. Therefore, it is possible to substantially uniformalize the thicknesses of the high dielectric films in the capacitors. Thus, it is possible to set the film thicknesses of the high dielectric films at the lower limit values in consideration of leakage currents and withstand voltages.

In the prior art, on the other hand, the capacitors are formed along the upper surface of the interlayer insulating film and the regions located on the contact holes, and hence steps are formed on surface portions of the capacitor electrodes located on the contact holes. This is because steps are unavoidably formed between the upper surfaces of the plugs in the contact holes and the upper surface of the interlayer insulating film in formation of the plugs.

Therefore, the high dielectric films which are formed on the surfaces of the capacitor electrodes are provided with locally thinned portions on the steps. Consequently, the lower limits for the high dielectric films must be set at the locally reduced thicknesses. Thus, the thicknesses of the high dielectric films in the capacitors are in excess of the lower limits as the result.

According to the present invention, it is possible to uniformly set the thicknesses of the high dielectric films at the lower limits in the capacitors, whereby it is possible to reduce the thicknesses of the high dielectric films as compared with the prior art. Thus, it is possible to improve the capacitances of the capacitors as compared with the prior art.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a semiconductor substrate of a first conductivity type having a main surface;
   an impurity region of a second conductivity type formed in said main surface of said semiconductor substrate;
   an interlayer insulating film, formed on said main surface of said semiconductor substrate, having a contact hole reaching a surface of said impurity region;
   a capacitor, formed only on an upper surface portion of said interlayer insulating film excluding a portion on said contact hole, including a first electrode, a high dielectric film consisting of a material having a high dielectric constant formed on said first electrode, and a second electrode formed on said high dielectric film; and
   a conductor part formed at least in said contact hole for electrically connecting said first or second electrode with said impurity region, wherein
   said conductor part includes a plug electrode embedded in said contact hole,
   said high dielectric film and said first electrode extend onto said plug electrode, and
   said second electrode is formed on said high dielectric film excluding a portion on said contact hole.

2. A semiconductor memory device in accordance with claim 1, wherein
   said first electrode is made of at least one material selected from a group of Ir, Pt, Pd, Rh, Ni, W, a Pt alloy, a Pd alloy, an Rh alloy, an Ni alloy, a W alloy, $RuO_2$, $SrRuO_3$ and $ReO_2$.

3. A semiconductor memory device in accordance with claim 1, wherein said high dielectric film is a polycrystalline film having a perovskite crystal structure.

4. A semiconductor memory device comprising:
a semiconductor substrate of a first conductivity type having a main surface;
an impurity region of a second conductivity type formed in said main surface of said semiconductor substrate;
an interlayer insulating film, formed on said main surface of said semiconductor substrate, having a contact hole reaching a surface of said impurity region;
a capacitor, formed only on an upper surface portion of said interlayer insulating film excluding a portion on said contact hole, including a first electrode, a high dielectric film consisting of a material having a high dielectric constant formed on said first electrode, and a second electrode formed on said high dielectric film;
a conductor part formed at least in said contact hole for electrically connecting said first or second electrode with said impurity region;
a side wall insulating film formed between a side wall of said high dielectric film and an upper end portion of said contact hole; and
said second electrode formed extending from a portion on said side wall insulating film onto said high dielectric film.

5. A semiconductor memory device in accordance with claim 4, wherein
each of said second electrode and said conductor part is made of at least one material selected from a group of TiN, Pt and RuO$_2$.

6. A semiconductor memory device comprising:
a semiconductor substrate of a first conductivity type having a main surface;
an MOS transistor formed by first and second impurity regions of a second conductivity type being provided in said main surface of said semiconductor substrate defining a channel forming region, and a gate electrode being formed on said channel forming region with a gate insulating film interposed therebetween;
a first interlayer insulating film, being formed on said main surface of said semiconductor substrate to cover said MOS transistor, having a contact hole reaching a surface of said first impurity region;
a bit line formed in said first interlayer insulating film to be electrically connected with said second impurity region;
a capacitor, being formed only on an upper surface portion of said first interlayer insulating film excluding a portion on said contact hole, including a first electrode, a high dielectric film consisting of a material having a high dielectric constant formed on said first electrode, and a second electrode formed on said high dielectric film;
a conductor part formed at least in said contact hole for electrically connecting said first or second electrode with said first impurity region; and
a second interlayer insulating film being formed to cover a surface of said second electrode of said capacitor, wherein
said conductor part includes a plug electrode embedded in said contact hole,
said high dielectric film and said first electrode extend onto said plug electrode, and
said second electrode is formed on said high dielectric film excluding a portion on said contact hole.

7. A semiconductor memory device in accordance with claim 4, wherein the side wall insulating film is only formed between the side wall and the upper end portion and not on the high dielectric film.

* * * * *